US010153176B2

(12) United States Patent
Soda

(10) Patent No.: US 10,153,176 B2
(45) Date of Patent: Dec. 11, 2018

(54) MANUFACTURING METHOD OF SEMICONDUCTOR DEVICE AND TEMPLATE FOR NANOIMPRINT

(71) Applicant: Toshiba Memory Corporation, Minato-ku (JP)

(72) Inventor: Eiichi Soda, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 241 days.

(21) Appl. No.: 15/252,443

(22) Filed: Aug. 31, 2016

(65) Prior Publication Data

US 2017/0263445 A1 Sep. 14, 2017

Related U.S. Application Data

(60) Provisional application No. 62/305,717, filed on Mar. 9, 2016.

(51) Int. Cl.
*H01L 21/48* (2006.01)
*H01L 27/11582* (2017.01)
*G03F 7/00* (2006.01)

(52) U.S. Cl.
CPC ......... *H01L 21/486* (2013.01); *G03F 7/0002* (2013.01); *G03F 7/0037* (2013.01); *H01L 21/4846* (2013.01); *H01L 27/11582* (2013.01)

(58) Field of Classification Search
CPC ..................................................... H01L 21/48
See application file for complete search history.

(56) References Cited

U.S. PATENT DOCUMENTS

| 8,957,471 B2 | 2/2015 | Fukuzumi |
| 9,117,717 B2 | 8/2015 | Kokubun |

FOREIGN PATENT DOCUMENTS

| JP | 2009-170661 | 7/2009 |
| JP | 2010-85625 | 4/2010 |
| JP | 2012-119478 | 6/2012 |

*Primary Examiner* — Marvin Payen
(74) *Attorney, Agent, or Firm* — Oblon, McClelland, Maier & Neustadt, L.L.P.

(57) ABSTRACT

According to one embodiment, there is provided a manufacturing method of a semiconductor device. The method includes forming a film to be processed on a substrate. The method includes forming a first resist pattern on the film, the first resist pattern having a first stepped structure including a plurality of steps. The method includes forming a second resist pattern on the first resist pattern by use of a template for nanoimprint. The second resist pattern has a second stepped structure, which is arranged corresponding to the first stepped structure and is formed such that a step-up surface extends perpendicularly to a flat surface. The method includes processing the film through the second resist pattern and the first resist pattern.

4 Claims, 21 Drawing Sheets

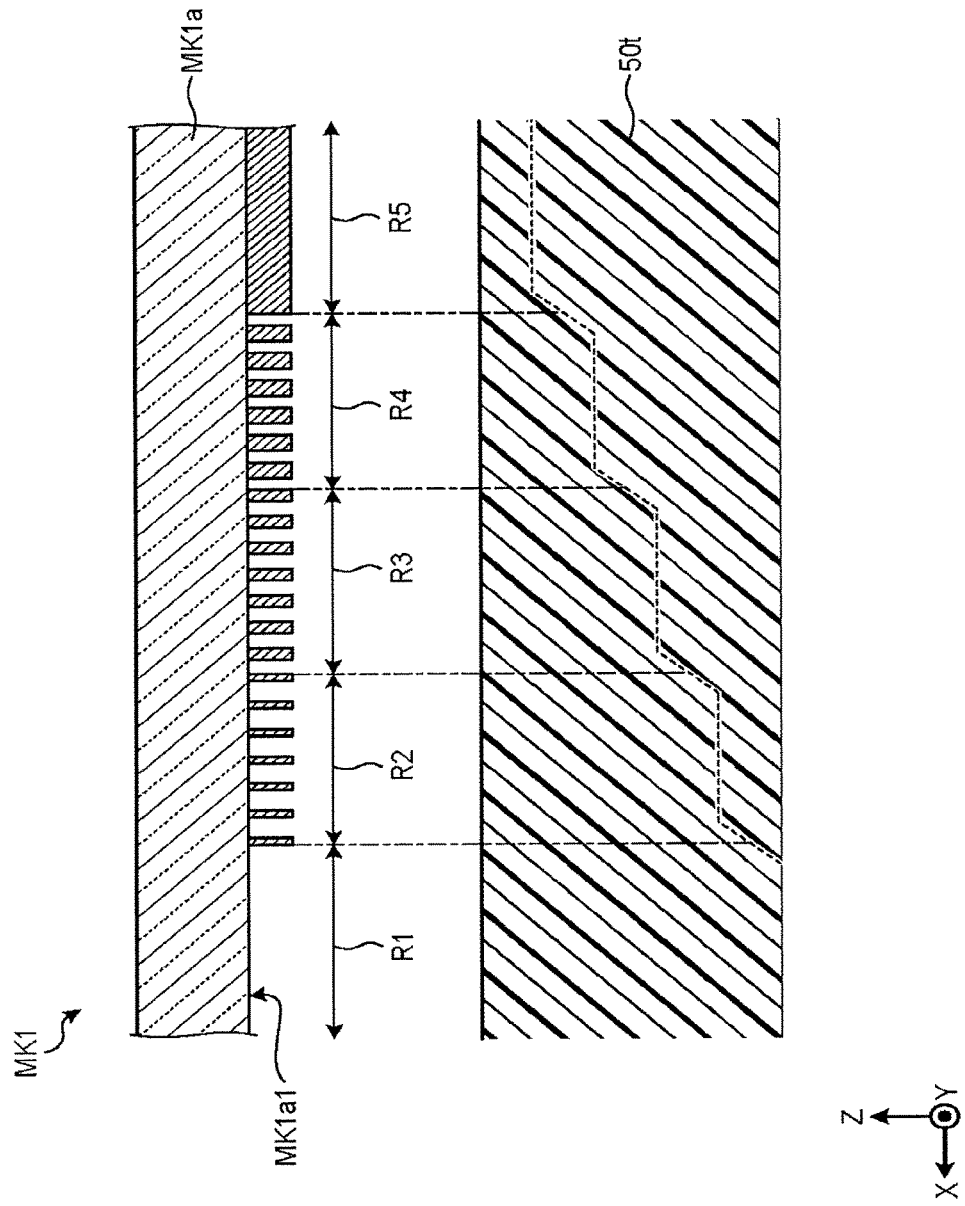

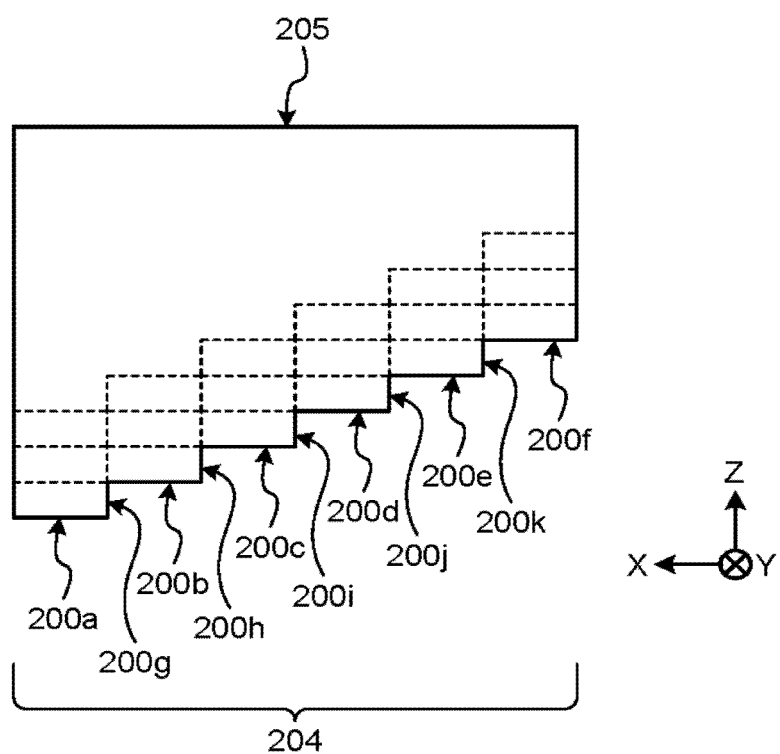

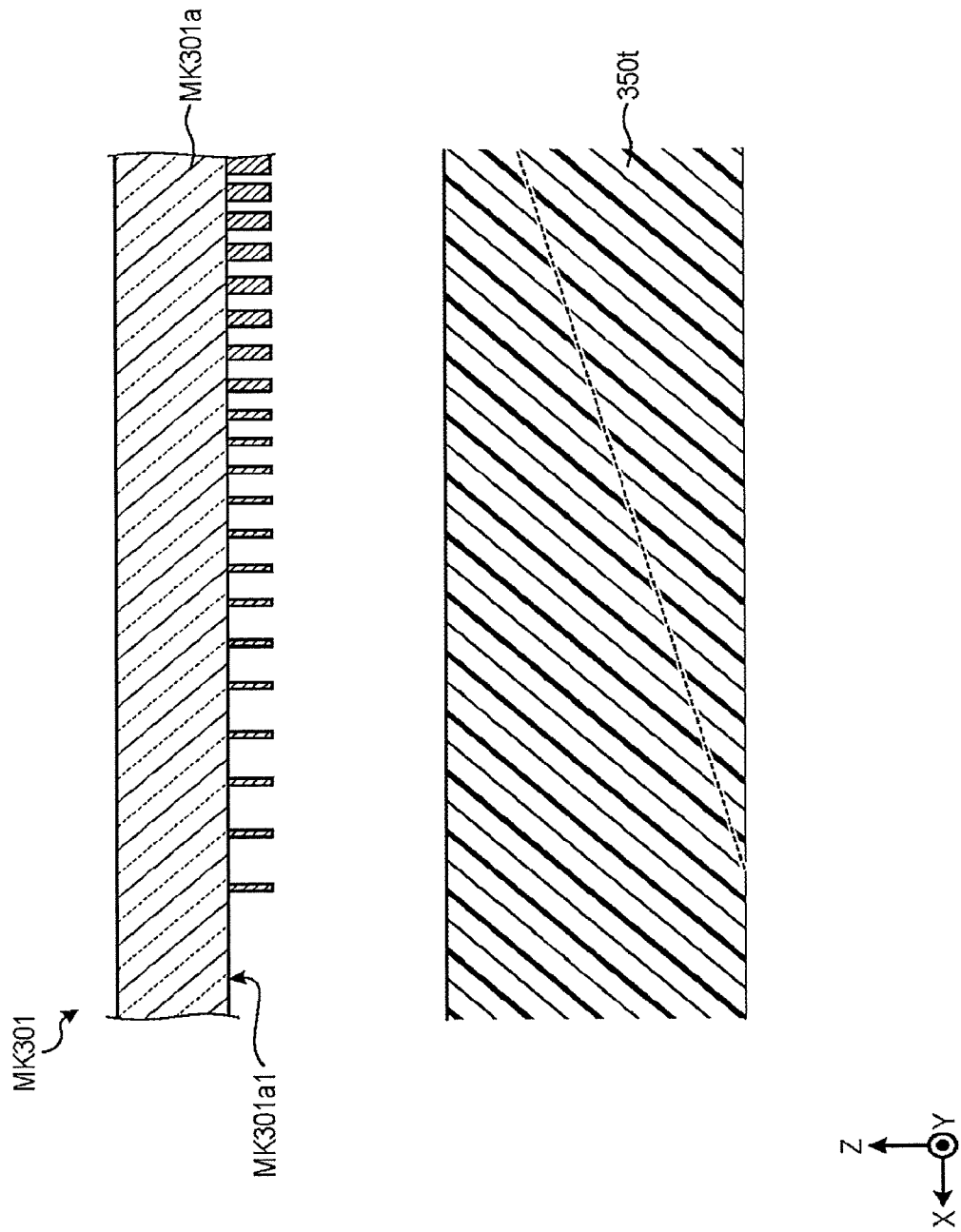

MANUFACTURING METHOD OF SEMICONDUCTOR DEVICE AND TEMPLATE FOR NANOIMPRINT

CROSS-REFERENCE TO RELATED APPLICATIONS

This application is based upon and claims the benefit of priority from U.S. Provisional Application No. 62/305,717, filed on Mar. 9, 2016; the entire contents of which are incorporated herein by reference.

FIELD

Embodiments described herein relate generally to a manufacturing method of a semiconductor device and a template for nanoimprint.

BACKGROUND

In manufacturing a semiconductor device including a three-dimensional array of memory cells, there is a case where multi-layer wiring lines are formed as a multi-stepped structure within an area for leading out wiring lines for accessing the memory cells. At this time, it is desired to form the stepped structure of the multi-layer wiring lines with high precision.

BRIEF DESCRIPTION OF THE DRAWINGS

FIG. 3 is a sectional view showing the configuration of a gray scale mask according to the first embodiment;

FIGS. 10B and 10C are a front view and a side view showing the configuration of the template for nanoimprint according to the second embodiment;

FIG. 12 is a sectional view showing the configuration of a gray scale mask according to a third embodiment;

DETAILED DESCRIPTION

In general, according to one embodiment, there is provided a manufacturing method of a semiconductor device. The method includes forming a film to be processed on a substrate. The method includes forming a first resist pattern on the film, the first resist pattern having a first stepped structure including a plurality of steps. The method includes forming a second resist pattern on the first resist pattern by use of a template for nanoimprint. The second resist pattern has a second stepped structure, which is arranged corresponding to the first stepped structure and is formed such that a step-up surface extends perpendicularly to a flat surface. The method includes processing the film through the second resist pattern and the first resist pattern.

Exemplary embodiments of a manufacturing method of a semiconductor device will be explained below in detail with reference to the accompanying drawings. The present invention is not limited to the following embodiments.

First Embodiment

An explanation will be given of a manufacturing method of a semiconductor device according to a first embodiment. According to a NAND flash memory of a three-dimensional type, the storage capacity can be increased also by increasing the number of stacked layers, and so such a memory can reduce the necessity for utilizing a more advanced patterning technique, and can thereby easily reduce the cost per bit.

As a NAND flash memory of a three-dimensional type, there is a design in which a memory array area is composed of a plurality of memory cells arrayed in a three-dimensional state, and in which a plurality of lines are led out in a stepwise state from the memory array area to a peripheral area to improve the accessibility to the three-dimensional array. Further, in this NAND flash memory of a three-dimensional type, the peripheral area may be designed such that a plurality of via-plugs extend in the depth direction respectively from predetermined wiring line layers at different depths, and thereby connect with the plurality of lines led out in a stepwise state.

Figure 1:
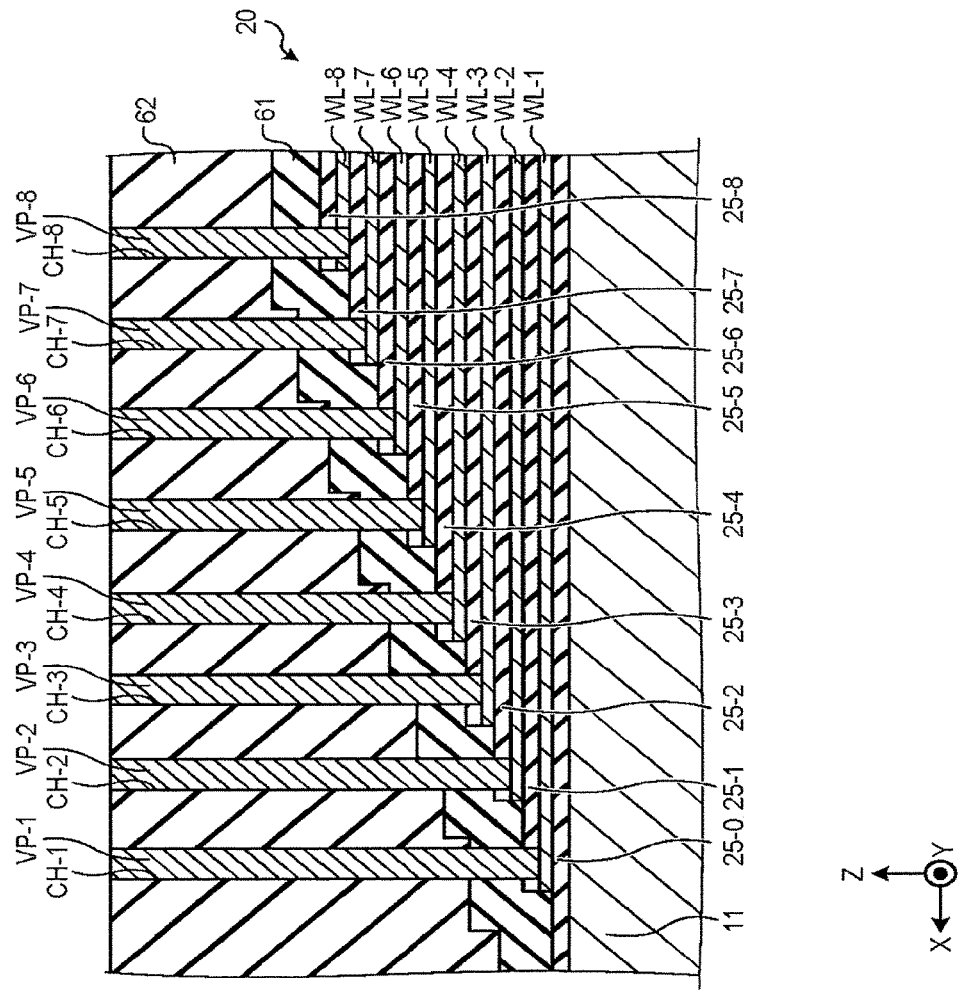
FIG. 1 is a sectional view showing the configuration of a semiconductor device according to a first embodiment.

For example, a semiconductor device 1 as shown in FIG. 1 is manufactured. FIG. 1 is a sectional view showing the configuration of the semiconductor device 1. In FIG. 1, a direction perpendicular to a surface 11a (see FIG. 4A) of a substrate 11 is a Z direction, and two directions perpendicular to each other in a plane perpendicular to the Z direction are an X direction and a Y direction, respectively.

In the semiconductor device 1, a voltage needs to be applied to each of the control electrodes (control gates) of memory cells (not shown) arrayed in the Z direction. Thus, word lines at respective levels (conductive films WL-1 to WL-8 at respective levels), which are respectively connected to the control electrodes, are led out in the X direction while they are formed in a stair shape, and then they are made to communicate with a plurality of via-plugs VP-1 to VP-8 having different depths in the Z direction.

The conductive films WL having such a stair shape is formed, for example, as follows. A film stack 20 is formed on the substrate 11 such that an insulating film (first film) 25 and a conductive film (second film) WL, which will serve as the control gate of a memory cell, are alternately stacked each in a plurality of layers. Within the memory array area (not shown), memory holes are formed in the film stack 20, and an MA(O)NOS structure is formed in each of the memory holes. Further, within the peripheral area (see FIG. 1), a stepped structure having a stair shape is formed on the film stack 20. Then, a stopper layer 61 and an interlayer insulating film 62 are deposited on the stepped structure of the film stack 20, and then contact holes CH-1 to CH-8 are formed in the interlayer insulating film 62, the stopper layer 61, and the respective insulating films 25 such that the flat surfaces of the stepped structure (the surfaces of the conductive films WL-1 to WL-8) are exposed. Then, a conductive material is embedded in the contact holes CH-1 to CH-8, and thereby via-plugs VP-1 to VP-8 respectively contacting with the conductive films WL are formed. Consequently, a structure is formed such that the plurality of via-plugs VP-1 to VP-8 respectively communicate with the conductive films WL-1 to WL-8.

As a method of forming the stepped structure having a stair shape on the film stack 20, there is a resist slimming process. In the resist slimming process, after the film stack 20 is formed on the substrate 11, a thick film resist (for example, a resist for an i-line light source or ArF light source) is applied onto the film stack 20, and is then exposed to light and developed, and thereby a resist pattern is formed. Then, there are alternately repeated a processing step in which the film stack 20 is processed under conditions of anisotropic etching, through the resist pattern serving as a mask, by use of dry etching, such as RIE (Reactive Ion Etching), and a resist slimming step in which the size of the resist pattern is reduced to set back a resist end under conditions of isotropic etching. Consequently, the stepped structure having a stair shape is formed on the film stack 20. In the case of the resist slimming process, since the processing step of the film stack 20 and the resist slimming step need to be alternately repeated a plurality of times, the number of manufacturing steps becomes larger, and thereby the manufacturing cost tends to be easily increased. Further, in the resist slimming process, since the isotropic etching is adopted in the resist slimming step, the initial film thickness of the resist needs to be larger, and thereby the processing size of the stair shape tends to become difficult to miniaturize.

As another method of forming the stepped structure having a stair shape on the film stack 20, there may be considered a technique in which a resist pattern including a stepped structure having a stair shape is formed by use of gray scale lithography, and then etching is performed through the resist pattern so that the stepped structure having a stair shape can be transferred onto the film stack 20. In the case of the gray scale lithography, since the resist slimming is not required, the number of manufacturing steps becomes smaller, and the initial film thickness of the resist can be smaller. Thus, the manufacturing cost can be reduced, and the processing size of the stair shape can be easily miniaturized.

However, in the gray scale lithography, since the step-up surfaces of the stepped structure come to have tapered shapes, if they are transferred onto the film stack 20 as they are, the step-up surfaces of the stepped structure of the film stack 20 also end up having tapered shapes. If the step-up surfaces of the stepped structure of the film stack 20 have tapered shapes, the flat surfaces of the stepped structure become difficult to form while the flat surfaces are kept stable in position and width. Consequently, as the arrangement pitch of via-plugs VP is set smaller, short-circuiting is more easily caused between upper and lower conductive films WL (between control gates), due to misalignment with respect to the via-plugs VP, and thereby the process yield may be deteriorated.

In consideration of the matter described above, according to this embodiment, a first resist pattern is formed by use of gray scale lithography, and then a second resist pattern is formed thereon by use of a template for nanoimprint, such that the second resist pattern includes a stepped structure, in which step-up surfaces are perpendicular to flat surfaces, and thereby the flat surfaces of the stepped structure can be formed while they are kept stable in position and width. In this embodiment, the "perpendicular" is not limited to a perfectly perpendicular state, but includes an almost perpendicular state.

Figure 4A:
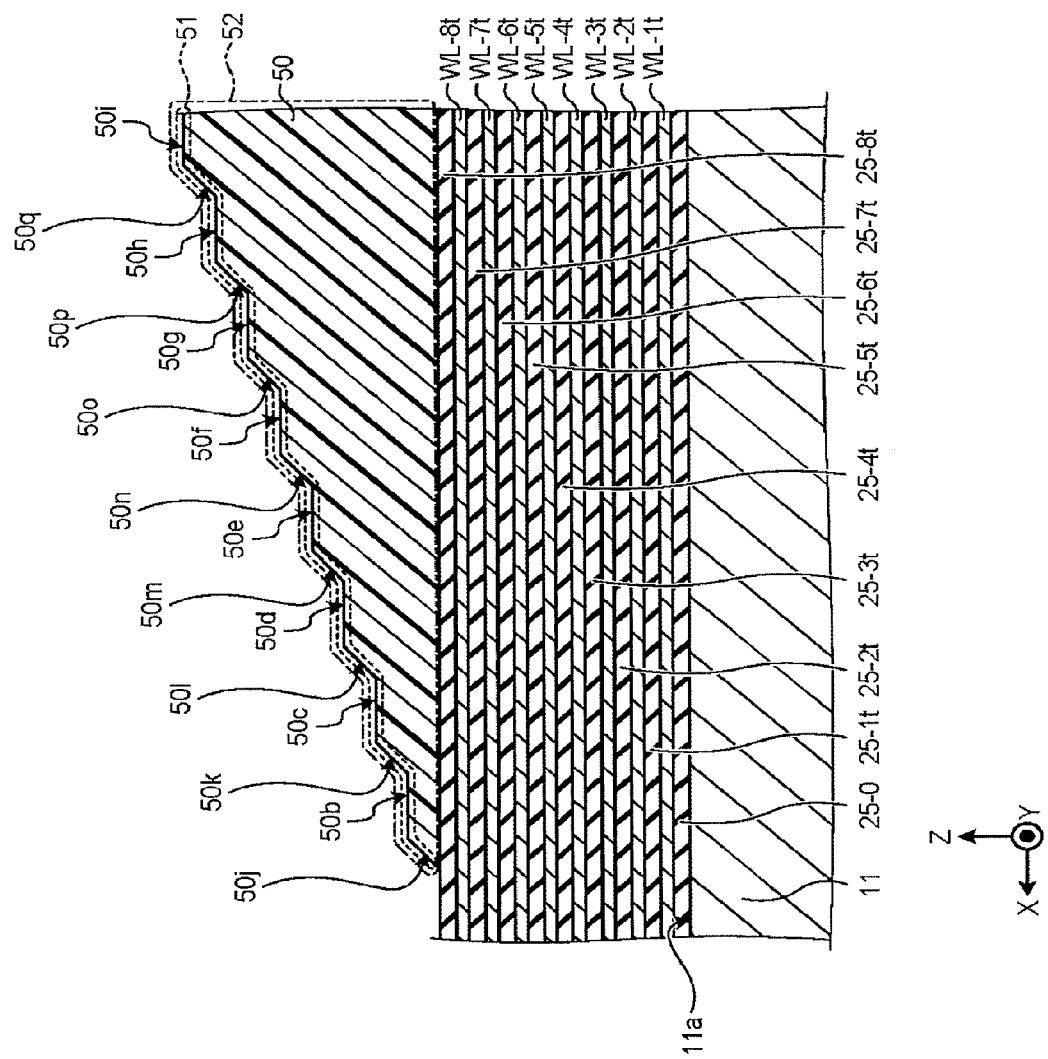
FIGS. 4A and 4B are sectional views showing the manufacturing method of a semiconductor device according to the first embodiment.
Figure 4B:
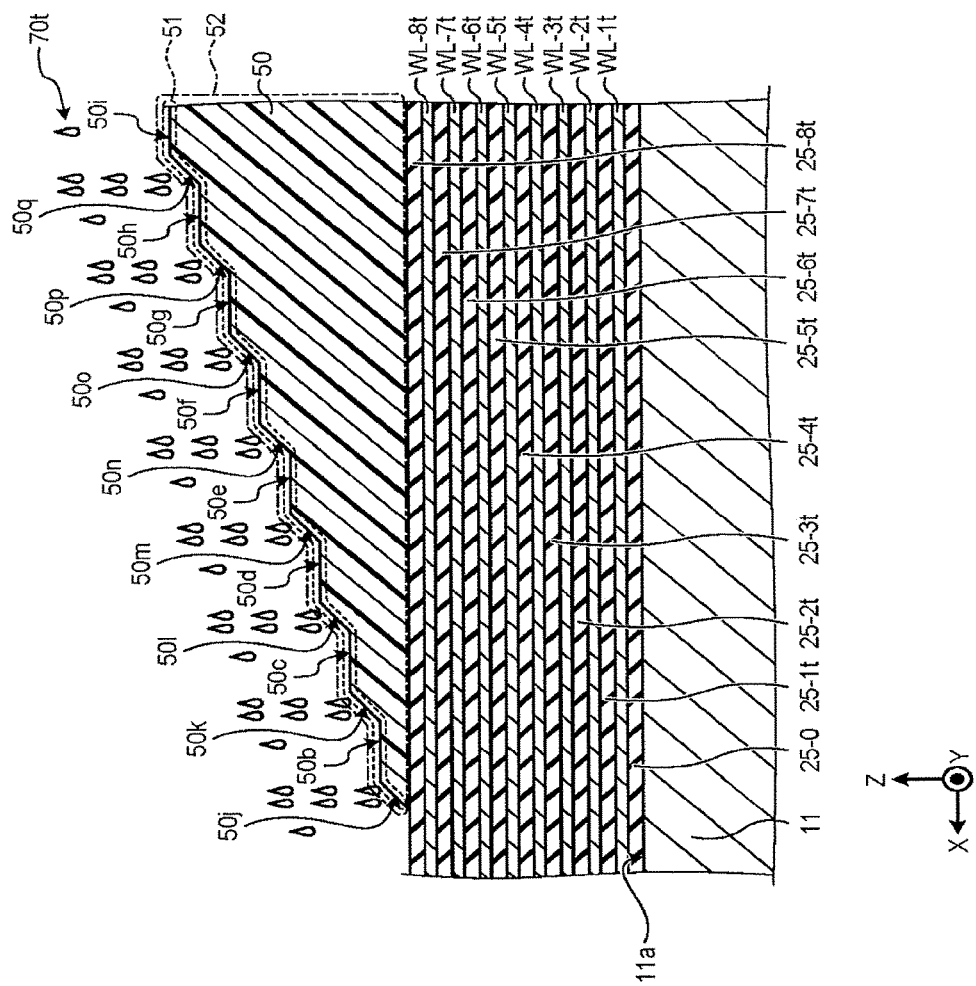
Figure 5:
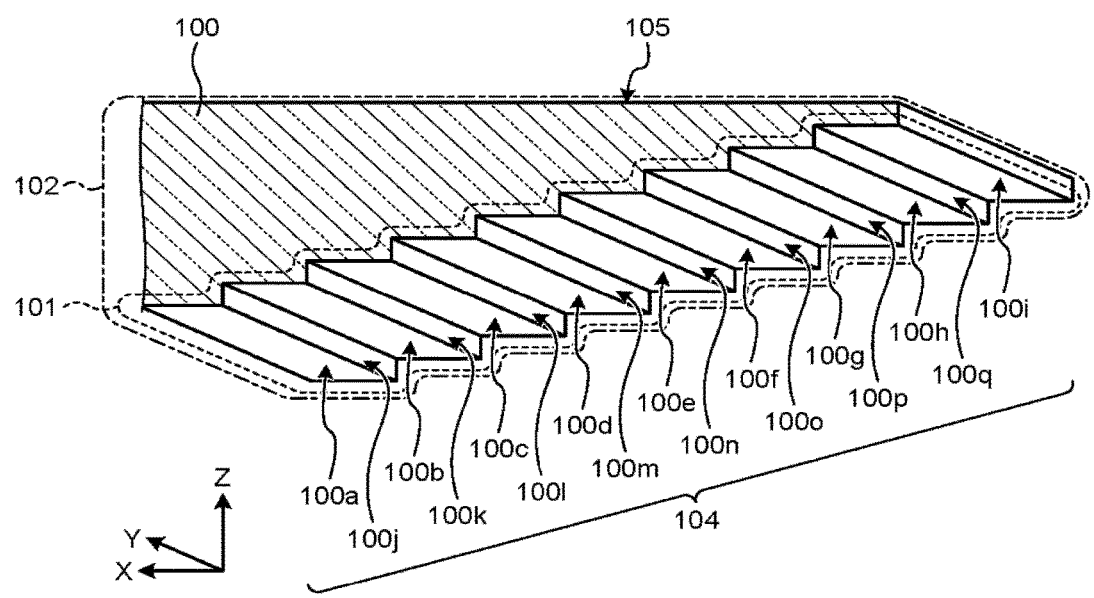
FIG. 5 is a perspective view showing the configuration of a template for nanoimprint according to the first embodiment.

Specifically, the semiconductor device 1 is manufactured as shown in FIGS. 2A to 8 and FIG. 1. FIGS. 2A, 2B, 4A, 4B, 6A, 6B, 7A, 7B, and 8 are sectional views showing a manufacturing method of the semiconductor device 1. FIG. 1 is a sectional view showing the configuration of the semiconductor device 1, but is utilized as a sectional view showing the manufacturing method of the semiconductor device 1. FIG. 3 is a sectional view showing the configuration of a gray scale mask. FIG. 5 is a perspective view showing the configuration of a template for nanoimprint. In the following description, an explanation will be given mainly of formation of the stairs structure in the peripheral area.

Figure 2A:
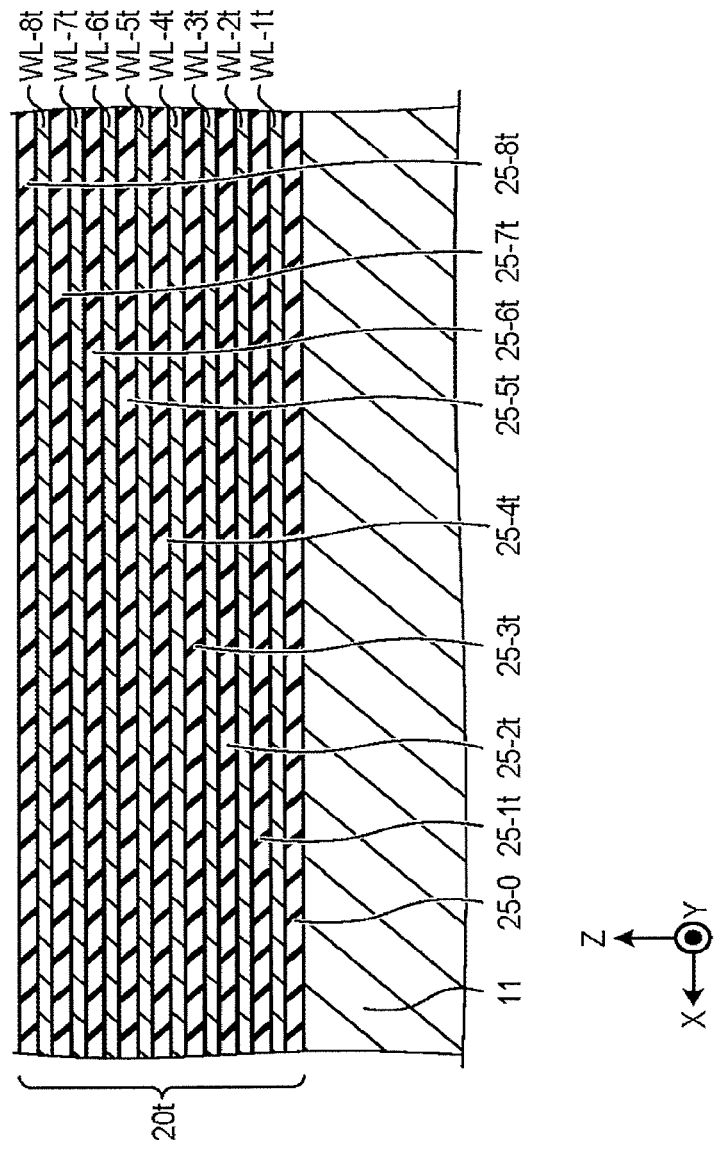
FIGS. 2A and 2B are sectional views showing a manufacturing method of a semiconductor device according to the first embodiment.

In the process step shown in FIG. 2A, a substrate 11 is prepared. The substrate 11 is made of a material containing a semiconductor, such as silicon, as the main component. On the substrate 11, an insulating film (first film) 25 and a conductive film (second film) WL are alternately stacked each in a plurality of layers, and thereby a film stack (processing object film) 20*t* is formed. For example, on the substrate 11, an insulating film 25-0, conductive film WL-1*t*, insulating film 25-1*t*, conductive film WL-2*t*, insulating film 25-2*t*, conductive film WL-3*t*, insulating film 25-3*t*, conductive film WL-4*t*, insulating film 25-4*t*, conductive film WL-5*t*, insulating film 25-5*t*, conductive film WL-6*t*, insulating film 25-6*t*, conductive film WL-7*t*, insulating film 25-7*t*, conductive film WL-8*t*, and insulating film 25-8*t* are deposited in this order, and thereby the film stack 20*t* is formed. Each of the insulating films 25 is formed by use of a CVD method or the like, for example, by depositing a material containing silicon oxide as the main component. Each of the insulating films 25 may be set to have a film thickness of about 50 nm, for example. Each of the conductive films WL may be formed by use of a CVD method or the like, for example, by depositing a material containing a metal, such as tungsten, as the main component, or by depositing a material containing a semiconductor, such as poly-silicon, doped with an impurity for imparting conductivity, as the main component. Each of the conductive films WL may be set to have a film thickness of about 50 nm, for example. Here, FIG. 2A shows an example where eight layers of the conductive film WL are formed, but the number of layers of the conductive film WL is arbitrary.

Figure 2B:
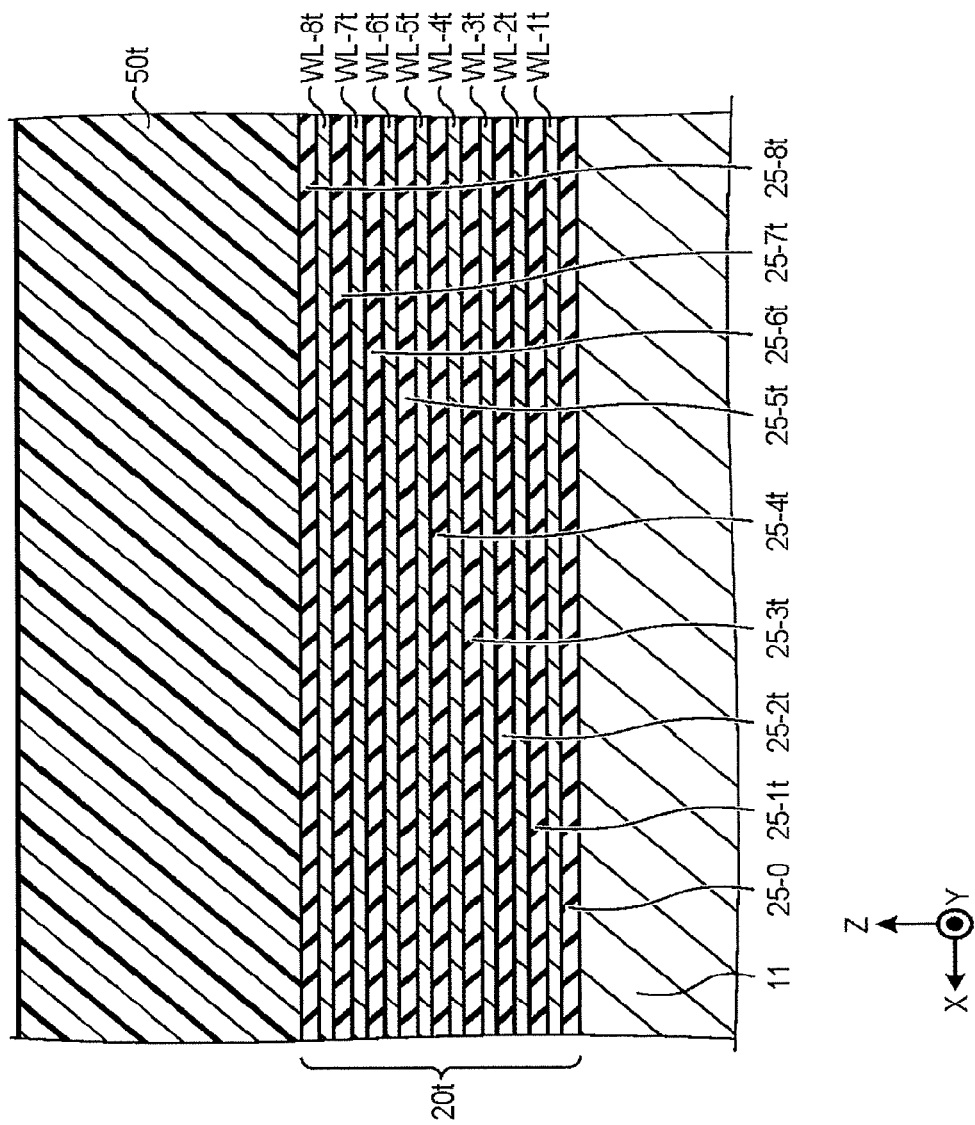

In the process step shown in FIG. 2B, a resist (photosensitive material) is applied onto the film stack 20*t*. For example, solution of the resist is applied onto film stack 20*t* (by use of, e.g., spin coating), and then the applied solution film is cured in a curing process, and thereby a resist coating film 50*t* is formed. When a thermosetting resin is employed as the solution, the curing process may be performed by baking and curing the solution film in a baking process with heating. Alternatively, when an ultraviolet curable resin is employed as the solution, the curing process may be performed by curing the solution film with ultraviolet irradiation.

Then, as shown in FIG. 3, a photo mask MK1 for gray scale lithography is prepared. The photo mask MK1 includes a pattern formed such that the light transmittance is set stepwise higher, as the position becomes closer to the +X side end in FIG. 3. The photo mask MK1 includes a pattern formed such that the aperture ratio is set stepwise higher, as the position becomes closer to the +X side end in FIG. 3.

The photo mask MK1 includes a base plate MK1a having a pattern face MK1a1, on which the mask pattern is formed not to exceed the resolution limit. The mask pattern is formed of line and space patterns having different pitches respectively at regions R1 to R5 arranged side by side in the X direction. In the line and space patterns, a line pattern (light shielding pattern) and a space pattern (light transmitting pattern) are alternately and repeatedly arranged in the X direction. For example, the base plate MK1a is made of a material having a certain light transmittancy, such as quartz. The light shielding pattern is made of a material that substantially does not transmit light, such as a chromium film. In the mask pattern (line and space patterns), the ratio of the light shielding patterns is set different at the respective regions R1 to R5. The arrangement pitch P of the line patterns is set larger, as the region is closer to the +X side end in FIG. 3, within a range of not exceeding the resolution limit of a light exposure apparatus (not shown). Where σ denotes the ratio between the image side numerical aperture and the object side numerical aperture in the light exposure apparatus, NA denotes the object side numerical aperture, and λ denotes the exposure light wavelength, the arrangement pitch P of the line patterns in the mask pattern satisfies the following formula 1.

$$P<\lambda/\{(1+\sigma)\times NA\} \quad \text{Formula 1}$$

Further, the effective light transmittance of the respective regions R1 to R5 in the mask pattern satisfies the following formula 2.

Light transmittance of region $R1$>Light transmittance of region $R2$>Light transmittance of region $R3$>Light transmittance of region $R4$>Light transmittance of region $R5$ \quad Formula 2

For example, in the case of KrF light exposure, if it uses a wavelength λ=248 nm and illumination conditions including NA=0.60 and σ=0.45 for performing circular illumination, the arrangement pitch P of the line patterns needs to be set less than 285 nm. Then, the light shielding patterns of a chromium film can be formed to constitute the mask pattern (line and space patterns) having a pitch P=200 nm on the base plate MK1a (which is a value converted to be on the base plate). The regions R1 to R5 shown in FIG. 3 respectively have different values of the ratio of the line patterns in the mask pattern. For example, the region R1 is set with the line width=0 nm and the space=200 nm, the region R2 is set with the line width=80 nm and the space=120 nm, the region R3 is set with the line width=100 nm and the space=100 nm, the region R4 is set with the line width=120 nm and the space=80 nm, and the region R5 is set with the line width=200 nm and the space=0 nm. Consequently, the effective light transmittance of the respective regions R1 to R5 in the mask pattern can be set with (the light transmittance of the region R1, the light transmittance of the region R2, the light transmittance of the region R3, the light transmittance of the region R4, and the light transmittance of the region R5)=(100%, 60%, 50%, 40%, and 0%). Here, the width of each of the regions R1 is set to 1 μm (which is a value converted to be on the base plate), for example.

In the process step shown in FIG. 4A, a stepped structure having a stair shape is formed on the resist coating film 50t. Specifically, light exposure is performed to the resist coating film 50t by use of the photo mask MK1 for gray scale lithography (see FIG. 3). In accordance with the light transmittance of the mask pattern (line and space patterns), which is set stepwise different, the light exposure amount to the resist varies stepwise, so that a latent image pattern including a stepped structure having a stair shape is formed in the resist coating film 50t, as indicated by a broken line in FIG. 3. In the latent image pattern shown in FIG. 3, the flat surfaces of the stepped structure are formed corresponding to the main parts of the respective regions R1 to R5, and the inclined surfaces of the stepped structure are formed corresponding to parts near the boundaries between the regions R1 to R5. Then, the latent image pattern is developed, and thereby a resist pattern (first resist pattern) 50 including a stepped structure 52 having a stair shape 51 is formed, as shown in FIG. 4A. At this time, the respective step-up surfaces of the stepped structure 52 come to have tapered shapes. That is, the stepped structure 52 includes a plurality of steps, and thus has the stair shape 51, for example. In the stair shape 51, flat surfaces 50b to 50i and step-up surfaces 50j to 50q are alternately arranged, for example, in the X direction, such that the step-up surfaces 50j to 50q are respectively inclined relative to the adjacent flat surfaces 50b to 50i. In the stair shape 51, the heights of the flat surfaces 50c to 50i from the surface 11a of the substrate 11 are stepwise larger in a direction from the +X side to the −X side. In the stair shape 51, the plurality of step-up surfaces 50j to 50q are formed stepwise to have heights equal to each other, relative to the adjacent flat surfaces 50c to 50i.

In the process step shown in FIG. 4B, a resist 70t for nanoimprint lithography (NIL) is dropped onto the resist pattern 50. At this time, the droplet density can be set different in the respective regions by use of an ink-jet method or the like. For example, the resist 70t for NIL is applied such that the droplet density near the step-up surfaces is larger than the droplet density on the flat surfaces in order that the taper of the step-up surfaces can be shaped into perpendicular to the flat surfaces. That is, in the stepped structure 52 (stair shape 51), the resist is supplied onto the flat surfaces 50b to 50i by a first supply amount, and the resist is supplied onto the step-up surfaces 50j to 50q by a second supply amount. The second supply amount is larger than the first supply amount. Consequently, there is provided a state where the flat surfaces 50b to 50i and the step-up surfaces 50j to 50q in the stepped structure 52 (stair shape 51) of the resist pattern 50 are covered with the resist 70t for NIL (see FIG. 6A).

Then, a template 100 for NIL shown in FIG. 5 is prepared. For example, the template 100 is made of a material having a certain light transmittancy, such as quartz or transparent resin. The template 100 has a pattern face 104 and a rear face 105. The rear face 105 is the face opposite to the pattern face 104. The pattern face 104 has a stepped structure 102. The stepped structure 102 includes a plurality of steps, and thus has a stair shape 101, for example. In the stair shape 101, flat surfaces 100a to 100i and perpendicular surfaces 100j to 100q are alternately arranged, for example, in the X direction, such that the perpendicular surfaces 100j to 100q respectively extend perpendicularly to the adjacent flat surfaces 100b to 100i. In the stair shape 101, the distances of the flat surfaces 100a to 100i from the rear face 105 are stepwise larger in a direction from the −X side to the +X side. In the stair shape 101, the plurality of perpendicular surfaces 100*j* to 100*q* are formed stepwise to have heights equal to each other, relative to the adjacent flat surfaces 100*a* to 100*i*.

For example, the perpendicular surface 100*q* extends from the +X side end of the flat surface 100*i*, in a direction perpendicular to the flat surface 100*i*, with an orientation for going away from the rear face 105, (−Z direction). The flat surface 100*h* extends from the −Z side end of the perpendicular surface 100*q*, in a direction along the rear face 105, with an orientation for going away from the flat surface 100*i*, (+X direction).

The perpendicular surface 100*p* extends from the +X side end of the flat surface 100*h*, in a direction perpendicular to the flat surface 100*h*, with an orientation for going away from the rear face 105, (−Z direction). The flat surface 100*g* extends from the −Z side end of the perpendicular surface 100*p*, in a direction along the rear face 105, with an orientation for going away from the flat surface 100*h*, (+X direction).

The perpendicular surface 100*o* extends from the +X side end of the flat surface 100*g*, in a direction perpendicular to the flat surface 100*g*, with an orientation for going away from the rear face 105, (−Z direction). The flat surface 100*f* extends from the −Z side end of the perpendicular surface 100*o*, in a direction along the rear face 105, with an orientation for going away from the flat surface 100*f*, (+X direction).

The perpendicular surface 100*n* extends from the +X side end of the flat surface 100*f*, in a direction perpendicular to the flat surface 100*f*, with an orientation for going away from the rear face 105, (−Z direction). The flat surface 100*e* extends from the −Z side end of the perpendicular surface 100*n*, in a direction along the rear face 105, with an orientation for going away from the flat surface 100*g*, (+X direction).

The perpendicular surface 100*m* extends from the +X side end of the flat surface 100*e*, in a direction perpendicular to the flat surface 100*e*, with an orientation for going away from the rear face 105, (−Z direction). The flat surface 100*d* extends from the −Z side end of the perpendicular surface 100*m*, in a direction along the rear face 105, with an orientation for going away from the flat surface 100*e*, (+X direction).

The perpendicular surface 100*l* extends from the +X side end of the flat surface 100*d*, in a direction perpendicular to the flat surface 100*d*, with an orientation for going away from the rear face 105, (−Z direction). The flat surface 100*c* extends from the −Z side end of the perpendicular surface 100*l*, in a direction along the rear face 105, with an orientation for going away from the flat surface 100*d*, (+X direction).

The perpendicular surface 100*k* extends from the +X side end of the flat surface 100*c*, in a direction perpendicular to the flat surface 100*c*, with an orientation for going away from the rear face 105, (−Z direction). The flat surface 100*b* extends from the −Z side end of the perpendicular surface 100*k*, in a direction along the rear face 105, with an orientation for going away from the flat surface 100*c*, (+X direction).

The perpendicular surface 100*j* extends from the +X side end of the flat surface 100*b*, in a direction perpendicular to the flat surface 100*b*, with an orientation for going away from the rear face 105, (−Z direction). The flat surface 100*a* extends from the −Z side end of the perpendicular surface 100*j*, in a direction along the rear face 105, with an orientation for going away from the flat surface 100*b*, (+X direction).

It should be noted that the stepped structure 102 on the pattern face 104 of the template 100 for NIL may be formed by use of a process in which a resist is applied onto a base plate made of quartz or the like and is then exposed to light to form a pattern, such that this process is repeated a plurality of times corresponding to the number of steps of the stair shape. Alternatively, as the material of the base plate, a transparent resin may be used. In this case, the stepped structure 102 on the pattern face 104 of the template 100 for NIL may be formed by shaping a transparent resin in a resist slimming process or the like.

Figure 6A:
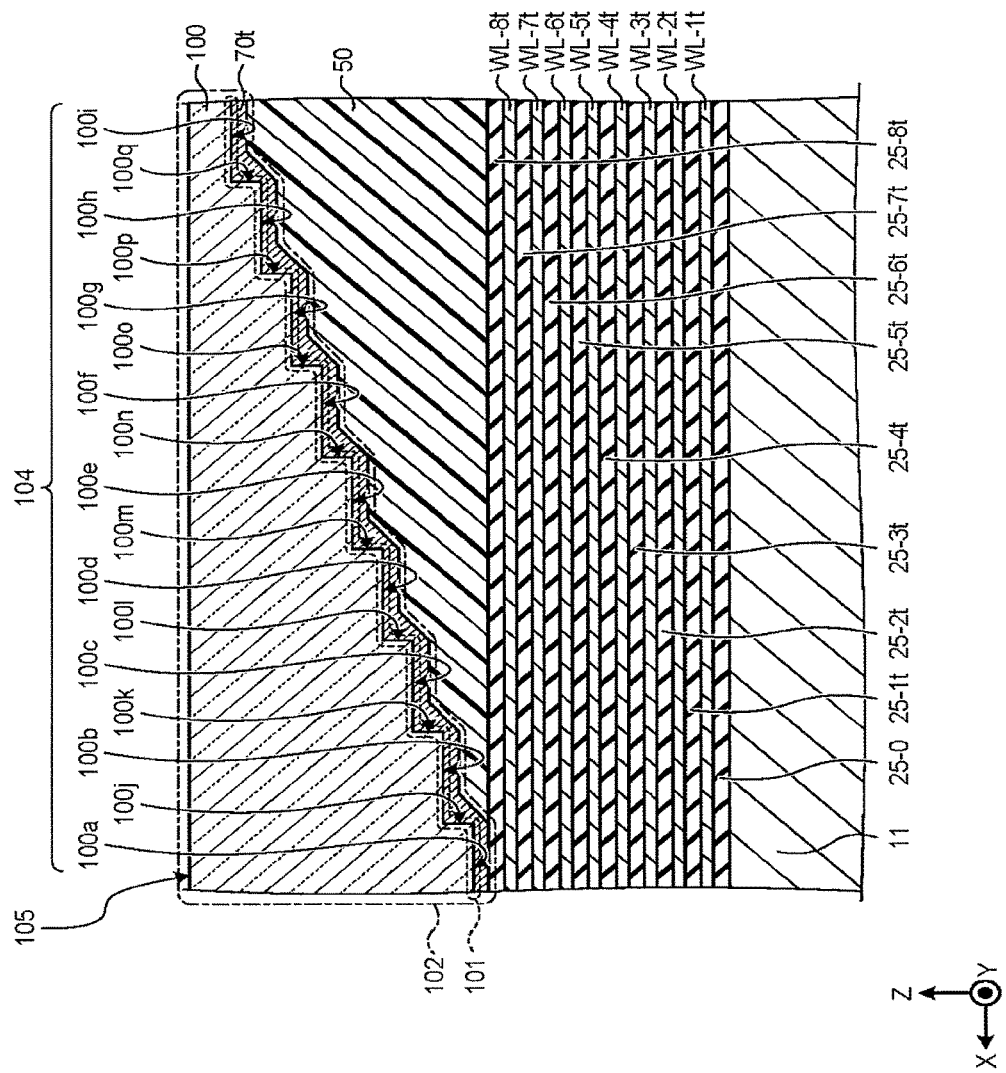
FIGS. 6A and 6B are sectional views showing the manufacturing method of a semiconductor device according to the first embodiment.

In the process step shown in FIG. 6A, a resist pattern 70 is formed on the resist pattern 50 by use of the template 100 for NIL. Specifically, the pattern face 104 of the template 100 is brought into contact with the resist 70*t* covering the resist pattern 50, and thereby the resist 70*t* flows onto the stepped structure 102 on the pattern face 104 by means of a capillary phenomenon. The template 100 and the resist 70*t* are kept in contact with each other for a predetermined time. Consequently, the resist 70*t* is filled onto the stepped structure 102 on the pattern face 104. That is, while there is kept a state where the flat surfaces 50*b* to 50*i* and the step-up surfaces 50*j* to 50*q* in the stepped structure 52 (stair shape 51) of the resist pattern 50 are covered with the resist 70*t*, there is obtained a state where the flat surfaces 100*a* to 100*i* and the perpendicular surfaces 100*j* to 100*q* in the stepped structure 102 (stair shape 101) of the template 100 are covered with the resist 70*t*. In this state, the resist 70*t* is cured in a curing process. When a thermosetting resin is employed as the resist 70*t*, the curing process may be performed by baking and curing the resist 70*t* in a baking process with infrared irradiation heating through the template 100. Alternatively, when an ultraviolet curable resin is employed as the resist 70*t*, the curing process may be performed by curing the resist 70*t* with ultraviolet irradiation through the template 100 (UV cure).

Figure 6B:
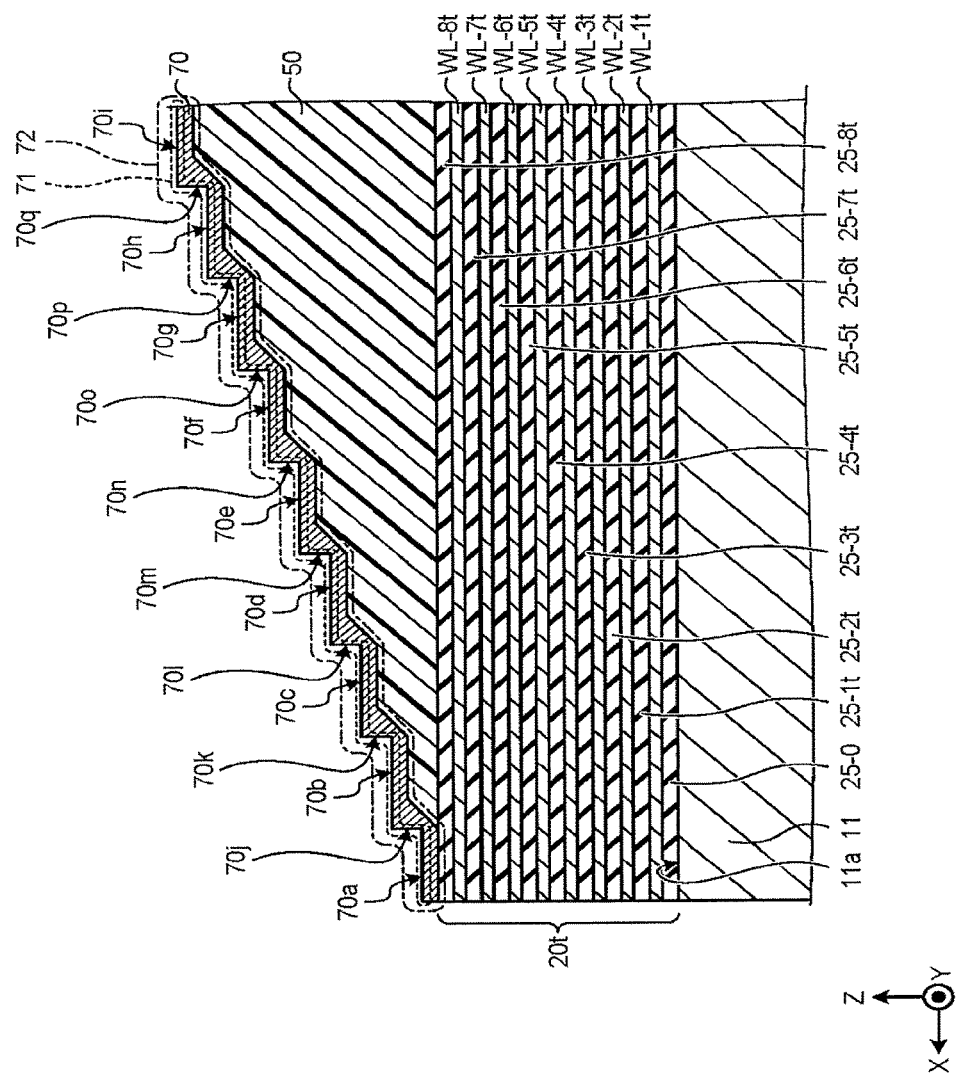

In the process step shown in FIG. 6B, the template 100 is separated, and thereby the resist pattern 70 is formed on the resist pattern 50. The resist pattern 70 has a stepped structure 72. The stepped structure 72 is a structure arranged corresponding to the stepped structure 52 (see FIG. 4B), and it includes a plurality of steps, and thus has a stair shape 71, for example. In the stair shape 71, flat surfaces 70*a* to 70*i* and step-up surfaces 70*j* to 70*q* are alternately arranged, for example, in the X direction, such that the step-up surfaces 70*j* to 70*q* respectively extend perpendicularly to the adjacent flat surfaces 70*b* to 70*i*. Consequently, the flat surfaces 70*a* to 70*i* of the stepped structure 72 (stair shape 71) can be easily formed while the flat surfaces 70*a* to 70*i* are kept stable in position and width. In the stair shape 71, the heights of the flat surfaces 70*a* to 70*i* from the surface 11*a* of the substrate 11 are stepwise larger in a direction from the +X side to the −X side. In the stair shape 71, the plurality of step-up surfaces 70*j* to 70*q* are formed stepwise to have heights equal to each other, relative to the adjacent flat surfaces 70*a* to 70*i*. The step-up surfaces 70*j* to 70*q* have heights relative to the adjacent flat surfaces 70*a* to 70*i*, such that each of the heights corresponds to the film thickness of a repetition unit in the film stack 20*t*, which specifically is the sum of the thickness of one insulating film 25 and the thickness of one conductive film WL. Each of the step-up surfaces 70*j* to 70*q* may be set to have a height corresponding to a value obtained by adding a process margin for dry etching to the sum of the thickness of one insulating film 25 and the thickness of one conductive film WL, for example.

Figure 7A:
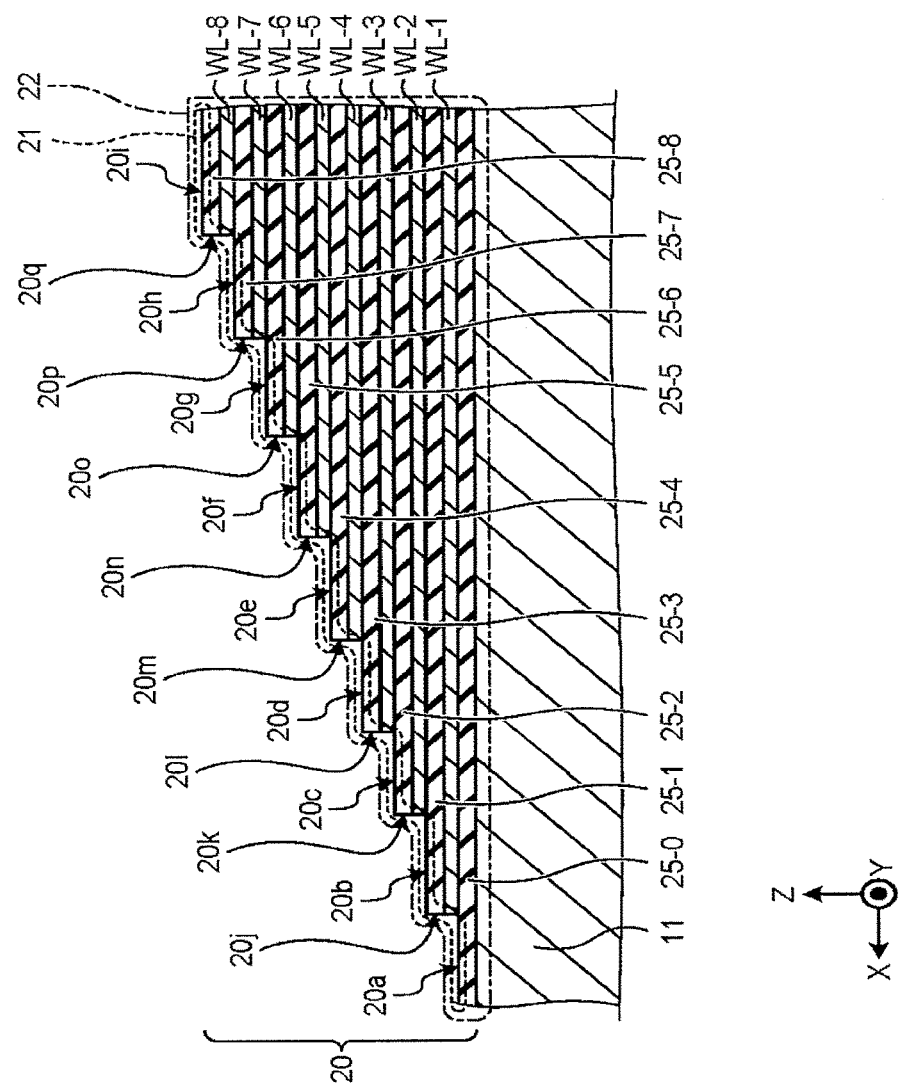
FIGS. 7A and 7B are sectional views showing the manufacturing method of a semiconductor device according to the first embodiment.

In the process step shown in FIG. 7A, the film stack 20*t* (see FIG. 2B) is processed through the resist pattern 70 and the resist pattern 50, and thereby a film stack 20 having a stepped structure is obtained. Specifically, etching back is performed to a resist remaining on the thinnest portion. As the etching back gas, HBr/O$_2$ is preferably used rather than O$_2$, to reduce side etching applied to the resist sidewall. Then, one step part (the insulating film 25-8*t* and the conductive film WL-8*t*) of the repetition unit in the film stack 20*t* is processed by etching, such as RIE, with a fluorocarbon gas or the like. That is, the exposed region of the insulating film 25-8*t* is processed by etching, and then the exposed region of the conductive film WL-8*t* is processed by etching. After this one step part (the insulating film 25-8*t* and the conductive film WL-8*t*) is processed by etching, if a resist still remains on the adjacent flat surface of the film stack 20*t*, etching back is performed selectively to the remaining resist. Then, the next one step part (the insulating film 25-7*t* and the conductive film WL-7*t*) in the film stack 20*t* is processed by etching, such as RIE, using a fluorocarbon gas or the like. By repeating the process described above, the film stack 20 having the stepped structure 22 (stair shape 21) is formed such that the step-up surfaces 20*j* to 20*q* extend perpendicularly to the flat surfaces 20*a* to 20*i*. That is, in the film stack 20, the conductive films WL-1 to WL-8 at respective levels are led out in the X direction while they are formed in the stair shape 21. The exposed surfaces of the insulating film 25-1 to 25-8 at respective levels respectively form the flat surfaces 20*a* to 20*i* in the stepped structure 22 (stair shape 21).

Figure 7B:
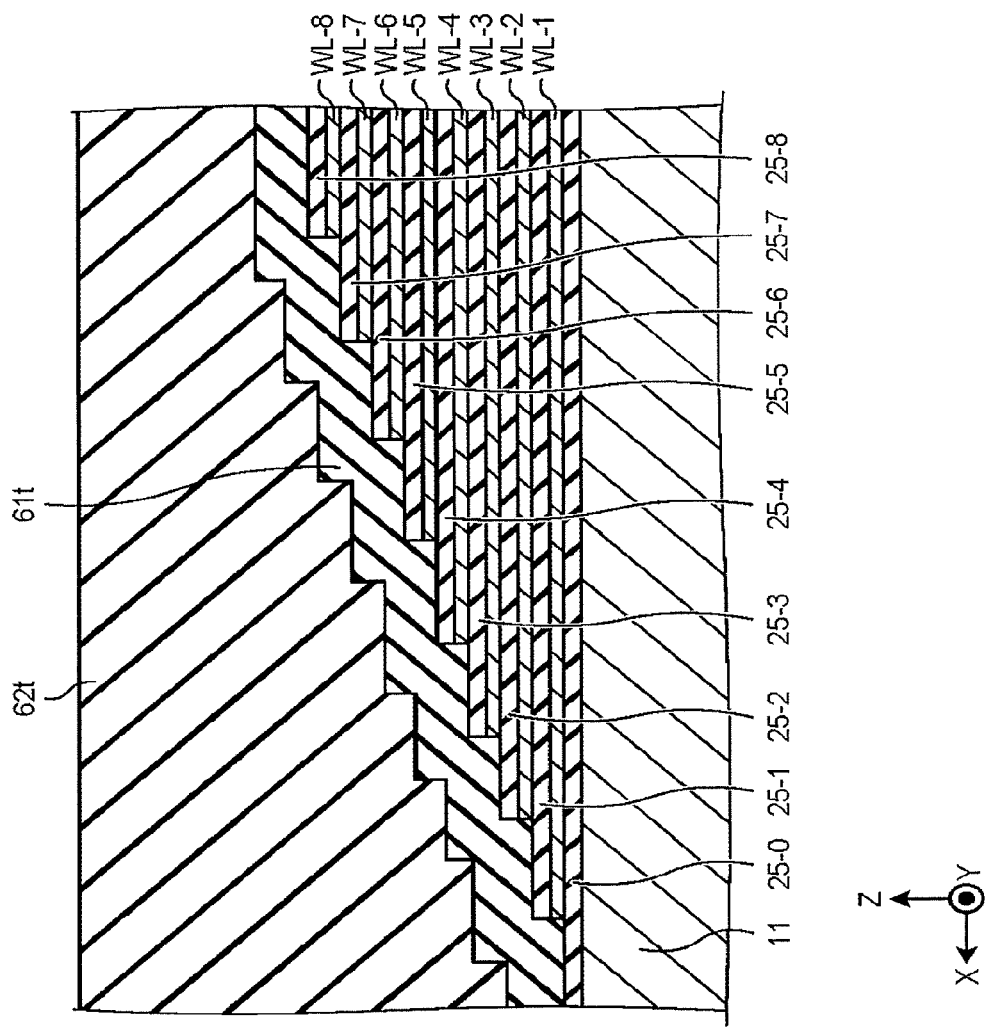

In the process step shown in FIG. 7B, a stopper layer 61*t* is formed to cover the stepped structure 22 (stair shape 21) of the film stack 20. The stopper layer 61*t* may be made of a material containing silicon nitride as the main component, for example. Further, an interlayer insulating film 62*t* is formed on the stopper layer 61*t*. The interlayer insulating film 62*t* may be made of a material, such as silicon oxide, which is different from that of the stopper layer 61*t*. Further, the upper surface of the interlayer insulating film 62*t* is planarized by use of a CMP (Chemical Mechanical Polishing) method or the like.

Then, a mask film (not shown) is formed on the interlayer insulating film 62*t*. The mask film includes openings at positions corresponding to the respective step portions in the stairs structure. These openings are patterns for forming contact holes.

Figure 8:
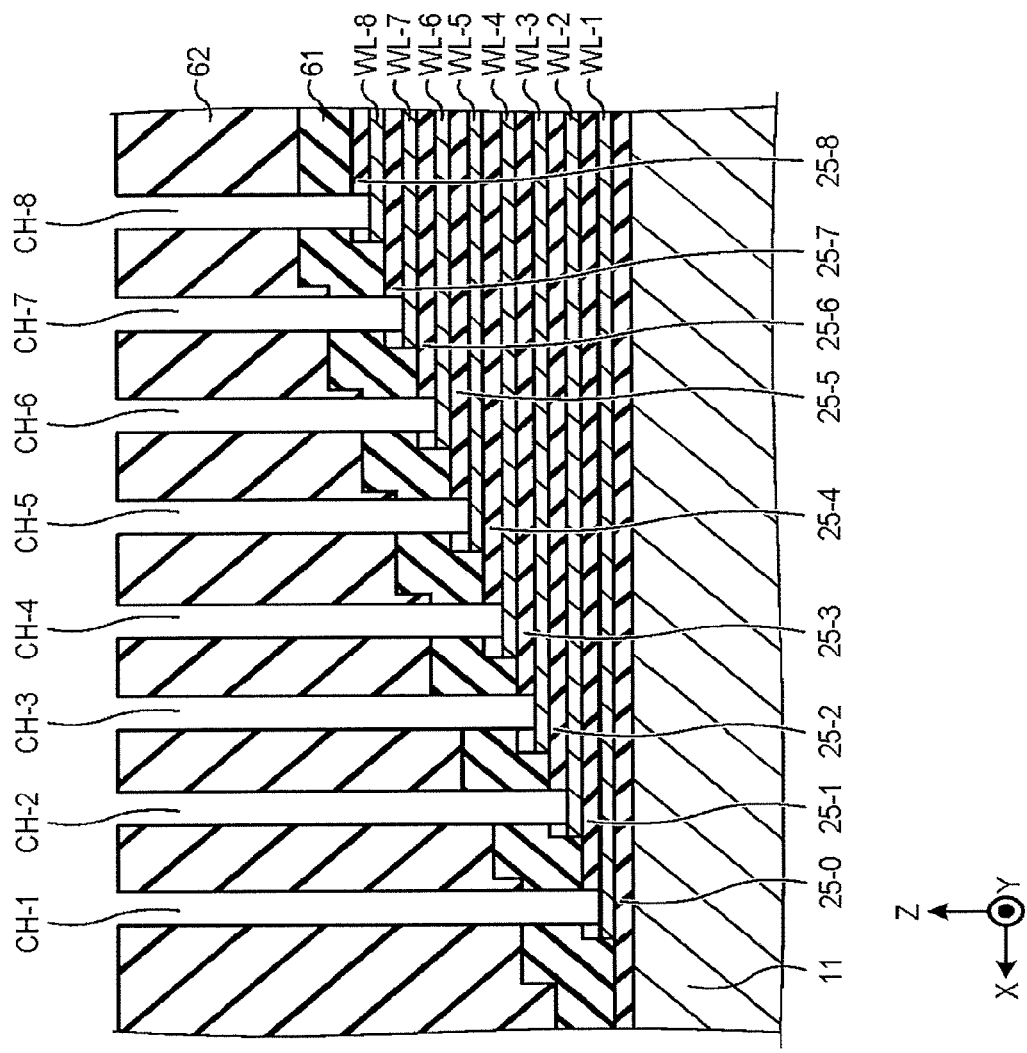
FIG. 8 is a sectional view showing the manufacturing method of a semiconductor device according to the first embodiment.

In the process step shown in FIG. 8, through the mask film serving as a mask, the interlayer insulating film 62, the stopper layer 61, and the respective insulating films 25 just below the stopper layer 61 are selectively etched by use of an RIE method. Consequently, a plurality of contact holes CH-1 to CH-8 are formed to penetrate the interlayer insulating film 62, the stopper layer 61, and the respective insulating films 25 just below the stopper layer 61. The plurality of contact holes CH-1 to CH-8 respectively have depths different from each other, from the upper surface of the interlayer insulating film 62. The contact holes CH-1 to CH-8 penetrate the interlayer insulating film 62, the stopper layer 61, and the respective insulating films 25 just below the stopper layer 61, and respectively reach the corresponding conductive films WL at respective levels.

The plurality of contact holes CH-1 to CH-8 are simultaneously and collectively formed. Since the conductive films WL-1 to WL-8 at a plurality of layers have been processed in a stepwise state, the plurality of contact holes CH-1 to CH-8 respectively reaching the conductive films WL-1 to WL-8 can be collectively formed in the same etching process, which is efficient. At this time, the stopper layer 61 made of, e.g., silicon nitride serves as an etching stopper, in etching the interlayer insulating film 62 made of, e.g., silicon oxide.

Thereafter, in the process step shown in FIG. 1, a conductive material is embedded into the contact holes CH-1 to CH-8, and thereby via-plugs VP-1 to VP-8 are formed. Specifically, at first, a first barrier film (such as a titanium film) is formed on the inner wall of each of the contact holes CH-1 to CH-8. Then, a second barrier film (such as a titanium nitride film) is formed on the inner side of the first barrier film. Further, a material having a good filling property, such as tungsten, is embedded on the inner side of the second barrier film. The first and second barrier films serve to prevent diffusion of the tungsten (W). In addition, the first and second barrier films serve as an adhering layer that closely contacts with both of the inner wall of the contact hole CH and the tungsten.

As described above, in the first embodiment, the resist pattern 50 is formed by use of gray scale lithography, and then the resist pattern 70 is formed thereon by use of the template 100 for NIL, such that the resist pattern 70 includes the stepped structure 72, in which the step-up surfaces 70*j* to 70*q* are perpendicular to the flat surfaces 70*a* to 70*i*. Consequently, the flat surfaces 70*a* to 70*i* of the stepped structure 72 can be easily formed while the flat surfaces 70*a* to 70*i* are kept stable in position and width. As a result, even if the arrangement pitch of the via-plugs VP is set smaller, short-circuiting between upper and lower conductive films WL (between control gates) due to misalignment with respect to the via-plugs VP is easily prevented, and thereby the manufacturing yield of the semiconductor device 1 can be easily improved.

Here, it is tentatively assumed that a resist for NIL is dropped onto the film stack 20*t* and then the template 100 for NIL is brought into contact with this resist. In this case, since a capillary phenomenon is utilized when the resist is filled onto the pattern face 104 of the template 100 for NIL, a flat surface of the stepped structure 102 on the pattern face 104 (for example, the flat surface 100*i* shown in FIG. 5), which is closer to the rear face 105, tends to be difficult to fill the resist thereon. Consequently, the resist for NIL becomes difficult to pattern into the resist pattern 70 having the stair shape 71 as shown in FIG. 6B.

On the contrary, in the first embodiment, the resist pattern 50 having the stair shape 51 is formed by use of gray scale lithography, and then the resist pattern 70 is formed thereon such that the resist pattern 70 has the stair shape 71 arranged corresponding to the stair shape 51. Consequently, the resist pattern 70 having the stair shape 71 can be easily formed.

Further, in the first embodiment, the number of steps in the stair shape can be arbitrarily set by adjusting the arrangement pitch of the light shielding patterns in the mask pattern for gray scale lithography, and by adjusting the number of steps or the like on the pattern face of the template 100 for NIL. For example, the chip surface area can be reduced by increasing the number of steps and reducing the terrace width. Alternatively, in place of the stair shape (see FIG. 6B) in which the height from the surface 11*a* of the substrate 11 is set gradually larger in a direction from the +X side to the −X side, another stair shape may be employed, and, for example, there may be employed a stair shape such that the height is set to vary in an almost W-shape in a direction from the +X side to the −X side, when viewed in the X-Z cross section.

It should be noted that, in the first embodiment, the film stack 20 is formed by alternately and repeatedly stacking the insulating film 25 and the conductive film WL each in a plurality of layers, but the film stack 20 may be formed by alternately and repeatedly stacking the insulating film 25 and a sacrificial film each in a plurality of layers. The sacrificial film may be made of an insulator different from the insulating film 25, and, if the insulating film 25 is made of a material containing silicon oxide as the main component, the sacrificial film may be made of a material containing silicon nitride as the main component. In this case, the film stack composed of layers of the insulating film 25 and layers of the sacrificial film alternately and repeatedly stacked may be processed, such that the layers of the sacrificial film are selectively etched to form gap spaces, and then a conductive film, such as a metal film made of, e.g., tungsten (W), or a silicon layer doped with an impurity for imparting conductivity, is formed in the gap spaces.

Further, a KrF resist is used as the resist material, but another resist, such as an i-line resist, ArF resist, or EUV resist, may be used. Further, as the resist for NIL, in place of an ordinary organic resist, an inorganic resist or metal-containing organic resist may be used. In this case, an inorganic or metal component is increased on the shoulder portions of the resist steps, and thereby the etching resistance at the shoulder portions of the resist steps is higher. Thus, when the etching is making progress in the film stack, the shoulder portions are less retreated, and so the step-up surfaces can be easily kept perpendicular to the flat surfaces.

Further, the process of making a step-up surface perpendicular to a flat surface in a stepped structure is not limited to a stair shape, but can be effectively used in a method of changing a round shape of a resist shoulder portion into a step-up surface perpendicular to a flat surface.

Second Embodiment

Next, an explanation will be given of a manufacturing method of a semiconductor device according to a second embodiment. In the following description, an explanation will be given mainly of portions different from those of the first embodiment.

In the first embodiment, the shape in which a step-up surface should be made perpendicular to a flat surface is exemplified by a stair shape formed in a stepwise state in one direction (X direction). However, in the second embodiment, the shape is exemplified by a stair shape formed in a stepwise state in two directions (X direction and Y direction). In this embodiment, the "stepwise state" is not limited to a perfectly stepwise state, but includes an almost stepwise state.

For example, after the process step shown in FIG. 2B, a photo mask MK2 (not shown) is prepared such that it includes the mask pattern shown in FIG. 3 in two directions (X direction and Y direction). This mask pattern may be realized by arranging L-shaped line patterns with the pitches and widths shown in FIG. 3 in two directions (X direction and Y direction), or it may be realized by arranging dot patterns with the pitches and widths shown in FIG. 3 in two directions (X direction and Y direction).

Figure 9A:
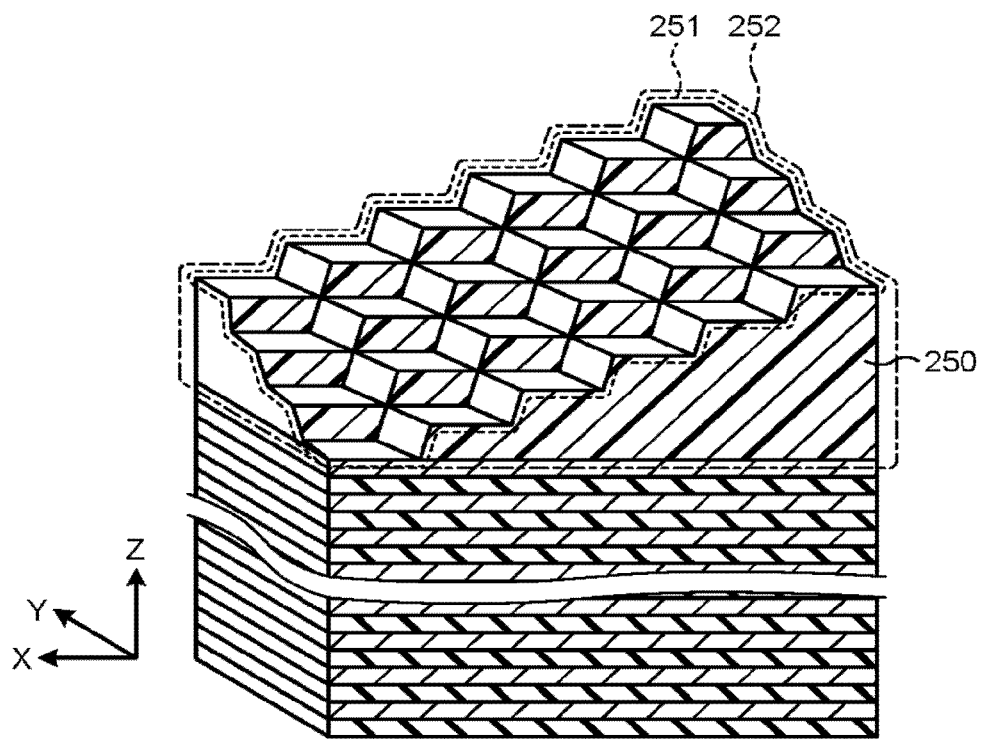
FIGS. 9A and 9B are perspective views showing a manufacturing method of a semiconductor device according to a second embodiment.

In the process step shown in FIG. 9A, a stepped structure is formed to have a stair shape set in a stepwise state in two directions (X direction and Y direction) on the resist coating film 50t. More specifically, light exposure is performed to the resist coating film 50t by use of the photo mask MK2 for gray scale lithography. In accordance with the light transmittance of the mask pattern, which is set stepwise different in the two directions (X direction and Y direction), the light exposure amount to the resist varies stepwise in the two directions (X direction and Y direction), so that a latent image pattern including a stepped structure having a stair shape in the two directions (X direction and Y direction) is formed in the resist coating film 50t. In the latent image pattern, the flat surfaces of the stepped structure are formed corresponding to the main parts of the respective regions R1 to R5, and the inclined surfaces of the stepped structure are formed corresponding to parts near the boundaries between the regions R1 to R5 (see FIG. 3). Then, the latent image pattern is developed, and thereby a resist pattern (first resist pattern) 250 including a stepped structure 252 having a stair shape 251 in the two directions (X direction and Y direction) is formed, as shown in FIG. 9A. At this time, the respective step-up surfaces of the stepped structure 252 come to have tapered shapes.

Figure 9B:
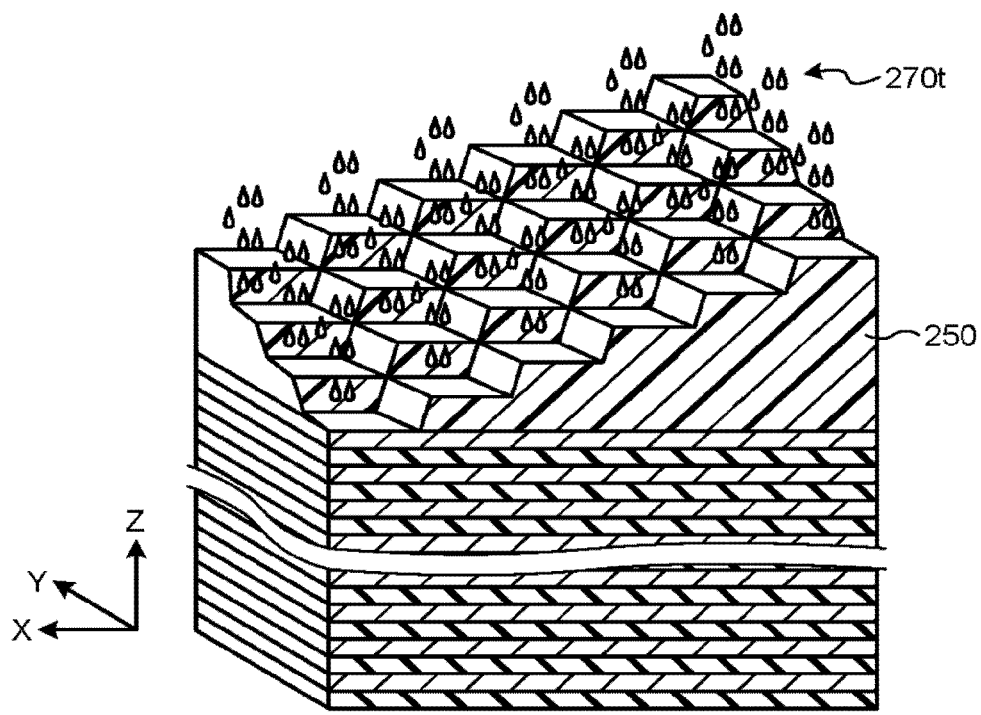

In the process step shown in FIG. 9B, a resist 270t for nanoimprint lithography (NIL) is dropped onto the resist pattern 250. At this time, the droplet density can be set different in the respective regions by use of an ink-jet method or the like. For example, the resist 270t for NIL is applied such that the droplet density near the step-up surfaces is larger than the droplet density on the flat surfaces in order that the taper of the step-up surfaces can be shaped into perpendicular to the flat surfaces. Consequently, there is provided a state where the flat surfaces and the step-up surfaces in the stepped structure 252 (stair shape 251) of the resist pattern 250 are covered with the resist 270t for NIL (see FIG. 11A).

Figure 10A:
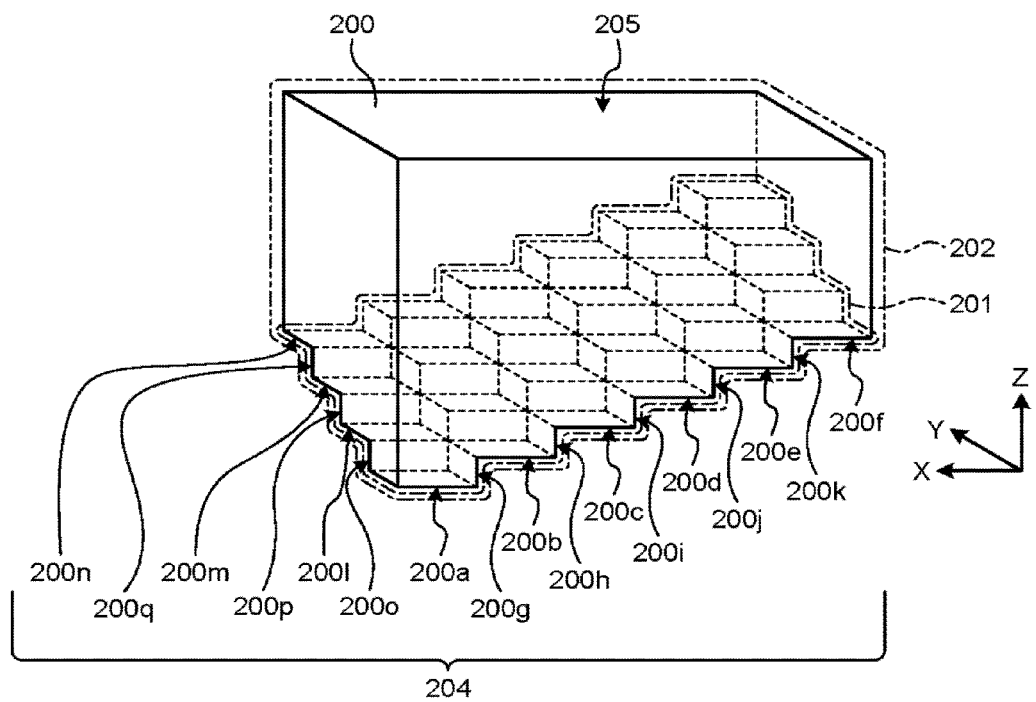
FIG. 10A is a perspective view showing the configuration of a template for nanoimprint according to the second embodiment.
Figure 10B:
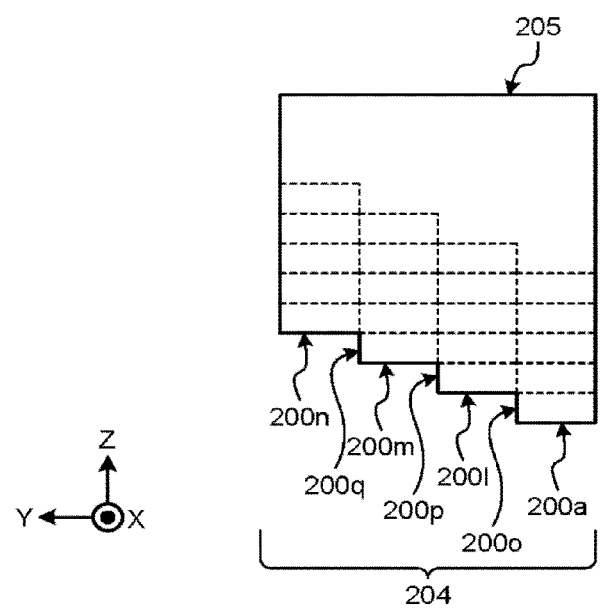

Then, a template 200 for NIL shown in FIGS. 10A to 10C is prepared. FIG. 10A is a perspective view showing the configuration of the template 200. FIG. 10B is a front view showing the configuration of the template 200. FIG. 10C is a side view showing the configuration of the template 200. The template 200 has a stepped structure 202 on its pattern face 204. The stepped structure 202 includes a plurality of steps in the two directions (X direction and Y direction), and thus has a stair shape 201 formed in a stepwise state in the two directions (X direction and Y direction), for example.

In the stair shape 201, flat surfaces 200a to 200f and perpendicular surfaces 200g to 200k are alternately arranged, for example, in the X direction, such that the perpendicular surfaces 200g to 200k respectively extend perpendicularly to the adjacent flat surfaces 200b to 200f. Further, in the stair shape 201, flat surfaces 200a, 200l, 200m, and 200n and perpendicular surfaces 200o, 200p, and 200q are alternately arranged, for example, in the Y direction, such that the perpendicular surfaces 200o, 200p, and 200q respectively extend perpendicularly to the adjacent flat surfaces 200a, 200l, 200m, and 200n.

In the stair shape 201, the distances of the flat surfaces 200a to 200f from the rear face 205 are stepwise larger in a direction from the −X side to the +X side, and the distances of the flat surfaces 200a, 200l, 200m, and 200n from the rear face 205 are stepwise larger in a direction from the −Y side to the +Y side. In the stair shape 201, the plurality of perpendicular surfaces 200g to 200k are formed stepwise to have heights equal to each other, relative to the adjacent flat surfaces 200a to 200f, and the plurality of perpendicular surfaces 200o, 200p, and 200q are formed stepwise to have heights equal to each other, relative to the adjacent flat surfaces 200a, 200l, 200m, and 200n.

For example, the perpendicular surface 200k extends from the +X side end of the flat surface 200f, in a direction perpendicular to the flat surface 200f, with an orientation for going away from the rear face 205, (−Z direction). The flat surface 200e extends from the −Z side end of the perpendicular surface 200k, in a direction along the rear face 205, with an orientation for going away from the flat surface 200f, (+X direction).

The perpendicular surface 200j extends from the +X side end of the flat surface 200e, in a direction perpendicular to the flat surface 200e, with an orientation for going away from the rear face 205, (−Z direction). The flat surface 200d extends from the −Z side end of the perpendicular surface 200j, in a direction along the rear face 205, with an orientation for going away from the flat surface 200e, (+X direction).

The perpendicular surface 200i extends from the +X side end of the flat surface 200d, in a direction perpendicular to the flat surface 200d, with an orientation for going away from the rear face 205, (−Z direction). The flat surface 200c extends from the −Z side end of the perpendicular surface 200i, in a direction along the rear face 205, with an orientation for going away from the flat surface 200e, (+X direction).

The perpendicular surface 200h extends from the +X side end of the flat surface 200c, in a direction perpendicular to the flat surface 200c, with an orientation for going away from the rear face 205, (−Z direction). The flat surface 200b extends from the −Z side end of the perpendicular surface 200h, in a direction along the rear face 205, with an orientation for going away from the flat surface 200c, (+X direction).

The perpendicular surface 200g extends from the +X side end of the flat surface 200b, in a direction perpendicular to the flat surface 200b, with an orientation for going away from the rear face 205, (−Z direction). The flat surface 200a extends from the −Z side end of the perpendicular surface 200g, in a direction along the rear face 205, with an orientation for going away from the flat surface 200b, (+X direction).

The perpendicular surface 200q extends from the −Y side end of the flat surface 200n, in a direction perpendicular to the flat surface 200n, with an orientation for going away from the rear face 205, (−Z direction). The flat surface 200m extends from the −Z side end of the perpendicular surface 200q, in a direction along the rear face 205, with an orientation for going away from the flat surface 200n, (−Y direction).

The perpendicular surface 200p extends from the −Y side end of the flat surface 200m, in a direction perpendicular to the flat surface 200m, with an orientation for going away from the rear face 205, (−Z direction). The flat surface 200l extends from the −Z side end of the perpendicular surface 200p, in a direction along the rear face 205, with an orientation for going away from the flat surface 200m, (−Y direction).

The perpendicular surface 200o extends from the −Y side end of the flat surface 200l, in a direction perpendicular to the flat surface 200l, with an orientation for going away from the rear face 205, (−Z direction). The flat surface 200a extends from the −Z side end of the perpendicular surface 200o, in a direction along the rear face 205, with an orientation for going away from the flat surface 200l, (−Y direction).

Figure 11A:
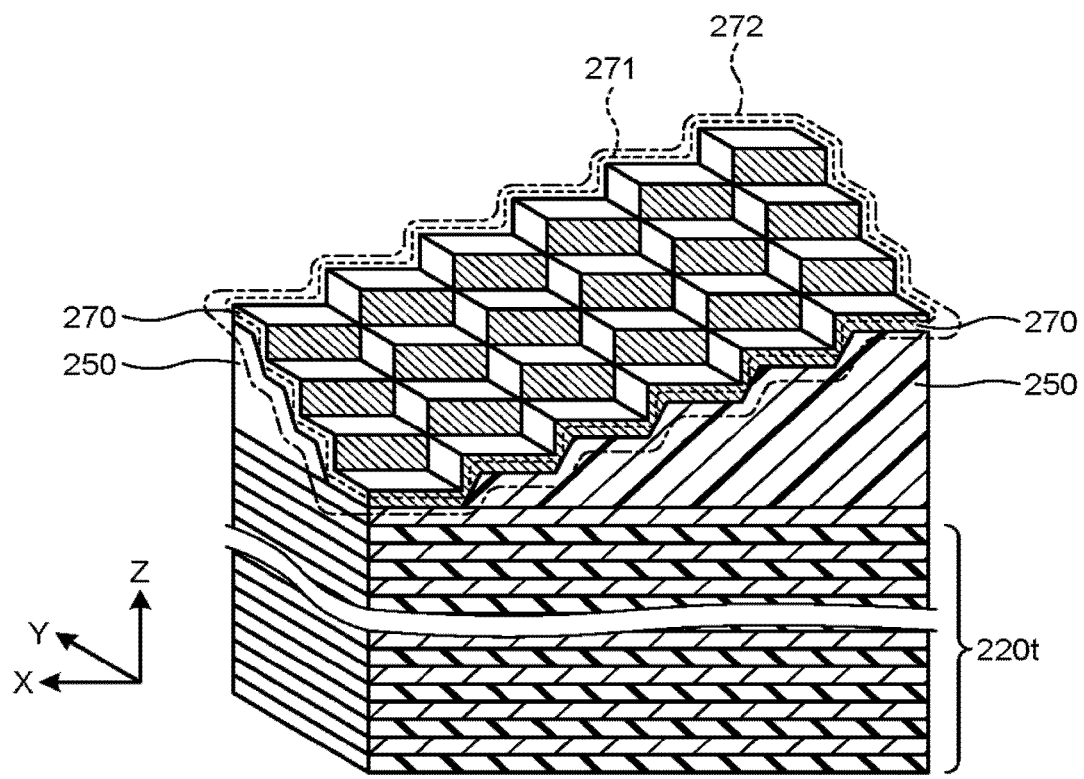
FIGS. 11A and 11B are perspective views showing the manufacturing method of a semiconductor device according to the second embodiment.

In the process step shown in FIG. 11A, a resist pattern 270 is formed on the resist pattern 250 by use of the template 200 for NIL. Specifically, the pattern face 204 of the template 200 is brought into contact with the resist 270t covering the resist pattern 250, and thereby the resist 270t flows onto the stepped structure 202 on the pattern face 204 by means of a capillary phenomenon. The template 200 and the resist 270t are kept in contact with each other for a predetermined time. Consequently, the resist 270t is filled onto the stepped structure 202 on the pattern face 204. In this state, the resist 270t is cured in a curing process.

Then, the template 200 is separated, and thereby the resist pattern 270 is formed on the resist pattern 250. The resist pattern 270 has a stepped structure 272. The stepped structure 272 is a structure arranged corresponding to the stepped structure 252 (see FIG. 9A), and it includes a plurality of steps in two directions (X direction and Y direction), and thus has a stair shape 271 formed in a stepwise state in the two directions (X direction and Y direction), for example. In the stair shape 271, for example, flat surfaces and step-up surfaces are alternately arranged in the X direction, and flat surfaces and step-up surfaces are alternately arranged in the Y direction, such that the step-up surfaces respectively extend perpendicularly to the adjacent flat surfaces. Consequently, the flat surfaces of the stepped structure 272 (stair shape 271) can be easily formed while the flat surfaces are kept stable in position and width in the two directions (X direction and Y direction).

Figure 11B:
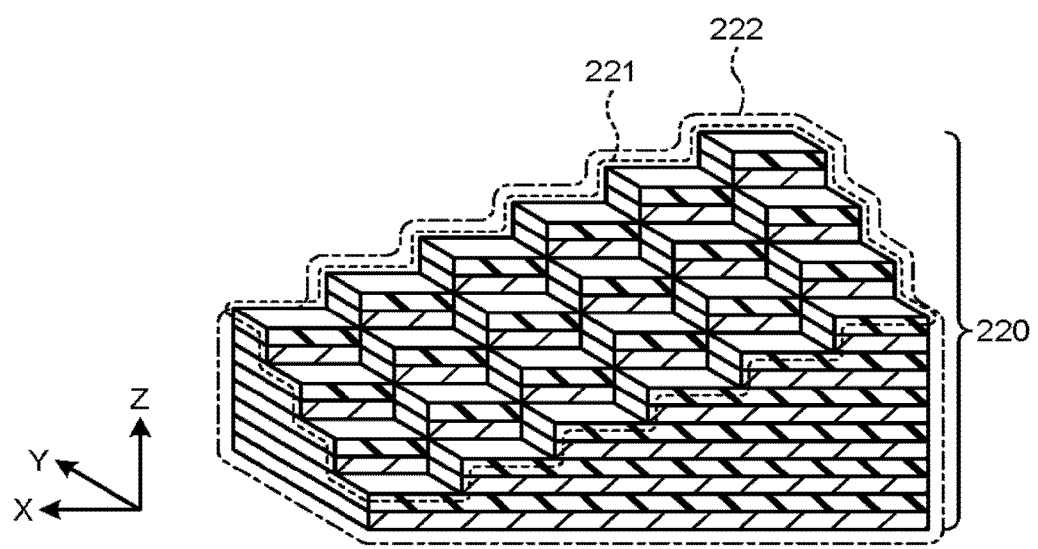

In the process step shown in FIG. 11B, the film stack 220t is processed through the resist pattern 270 and the resist pattern 250, and thereby a film stack 220 having a stepped structure formed in a stepwise state in the two directions (X direction and Y direction) is obtained. Here, the film stack 220 having the stepped structure 222 (stair shape 221) is formed such that the step-up surfaces extend perpendicularly to the flat surfaces in the two directions (X direction and Y direction). That is, in the film stack 220, the conductive films WL-1 to WL-8 at respective levels are led out in the X direction and the Y direction while they are formed in the stair shape 221. The exposed surfaces of the insulating film 25-1 to 25-8 at respective levels respectively form the flat surfaces in the stepped structure 222 (stair shape 221), in the two directions (X direction and Y direction).

As described above, in the second embodiment, the resist pattern 250 is formed with a stepped structure set in a stepwise state in two directions, and then the resist pattern 270 is formed thereon by use of the template 200 for NIL, such that the resist pattern 270 includes the stepped structure 272 set in a stepwise state in the two directions, in which the step-up surfaces are perpendicular to the flat surfaces. Consequently, the flat surfaces of the stepped structure 272 can be easily formed while the flat surfaces are kept stable in position and width in the two directions. As a result, even if the arrangement pitch of the via-plugs VP is set smaller, short-circuiting between upper and lower conductive films WL (between control gates) due to misalignment with respect to the via-plugs VP is easily prevented, and thereby the manufacturing yield of the semiconductor device 1 can be easily improved.

Further, in the second embodiment, the number of steps in the stair shape can be arbitrarily set by adjusting the arrangement pitch of the light shielding patterns in the mask pattern for gray scale lithography, and by adjusting the number of steps or the like on the pattern face of the template 200 for NIL. For example, the chip surface area can be reduced by increasing the number of steps and reducing the terrace width. Alternatively, in place of the stair shape (see FIG. 11A) in which the height from the surface 11a of the substrate 11 is set gradually larger in a direction from the +X side to the −X side, and the height from the surface 11a of the substrate 11 is set gradually larger in a direction from the −Y side to the +Y side, another stair shape may be employed, and, for example, there may be employed a stair shape such that the height is set to vary in an almost W-shape in a direction from the +X side to the −X side, when viewed in the X-Z cross section, and the height is set to vary in an almost W-shape in a direction from the +Y side to the −Y side, when viewed in the Y-Z cross section.

Third Embodiment

Next, an explanation will be given of a manufacturing method of a semiconductor device according to a third embodiment. In the following description, an explanation will be given mainly of portions different from those of the first embodiment.

In the first embodiment, the resist pattern 50 is formed in a stepwise state, and then the resist pattern 70 is formed thereon in a stepwise state by use of the template 100 for NIL. In the third embodiment, a resist pattern 350 is formed with an inclined surface structure, and then a resist pattern 370 is formed thereon in a stepwise state by use of a template 100 for NIL.

Specifically, in place of the photo mask MK1 shown in FIG. 3, a photo mask MK301 for gray scale lithography is prepared as shown in FIG. 12. The photo mask MK301 includes a gradation pattern formed such that the light transmittance is set gradually higher, as the position becomes closer to the +X side end in FIG. 12. The photo mask MK301 includes a gradation pattern formed such that the aperture ratio is set gradually higher, as the position becomes closer to the +X side end in FIG. 12.

The photo mask MK301 includes a base plate MK301a having a pattern face MK301a1, on which the mask pattern is formed not to exceed the resolution limit. The mask pattern is formed of line and space patterns having different pitches in a direction in which the position becomes closer to the +X side end. In the line and space patterns, a line pattern (light shielding pattern) and a space pattern (light transmitting pattern) are alternately and repeatedly arranged in the X direction. For example, the base plate MK301a is made of a material having a certain light transmittancy, such as quartz. The light shielding pattern is made of a material that substantially does not transmit light, such as a chromium film. The arrangement pitch P of the line patterns is set larger, as the position becomes closer to the +X side end in FIG. 12, within a range of not exceeding the resolution limit of a light exposure apparatus (not shown).

Figure 13A:
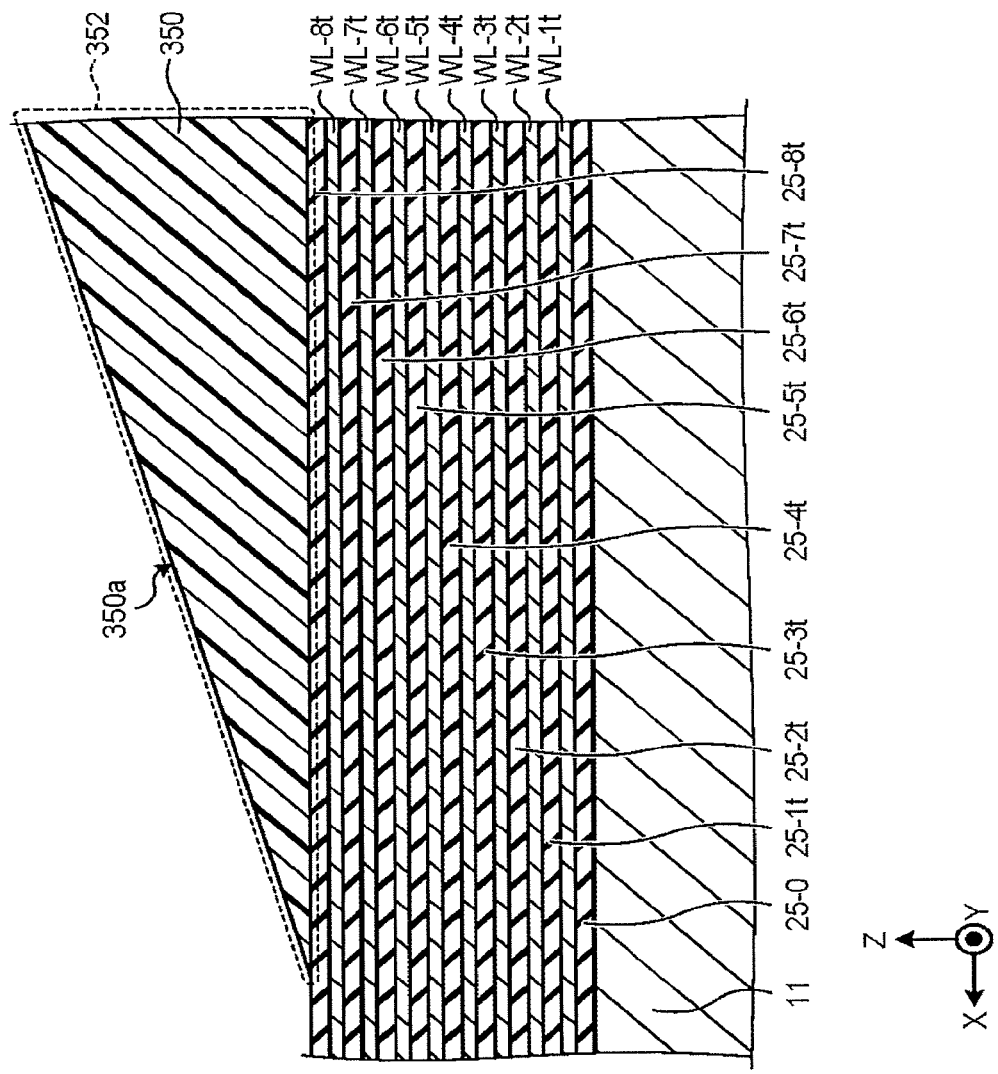
FIGS. 13A and 13B are sectional views showing a manufacturing method of a semiconductor device according to the third embodiment.

In the process step shown in FIG. 13A, an inclined surface structure is formed on a resist coating film 350t (see FIG. 12). Specifically, light exposure is performed to the resist coating film 350t by use of the photo mask MK301 for gray scale lithography (see FIG. 12). In accordance with the light transmittance set gradually different in the mask pattern (line and space patterns), the light exposure amount to the resist varies gradually, so that a latent image pattern including an inclined surface structure is formed in the resist coating film 350t, as indicated by a broken line in FIG. 12. In the latent image pattern shown in FIG. 12, an inclined surface is formed such that the height from the surface 11a of the substrate 11 becomes smaller, as the position becomes closer to the +X side end. Then, the latent image pattern is developed, and thereby a resist pattern (first resist pattern) 350 including an inclined surface structure 352 is formed, as shown in FIG. 13A. At this time, the inclined surface 350a of the inclined surface structure 352 come to have a tapered shape. That is, the inclined surface structure 352 includes the inclined surface 350a, which is uniformly inclined relative to the surface 11a of the substrate 11.

Figure 13B:
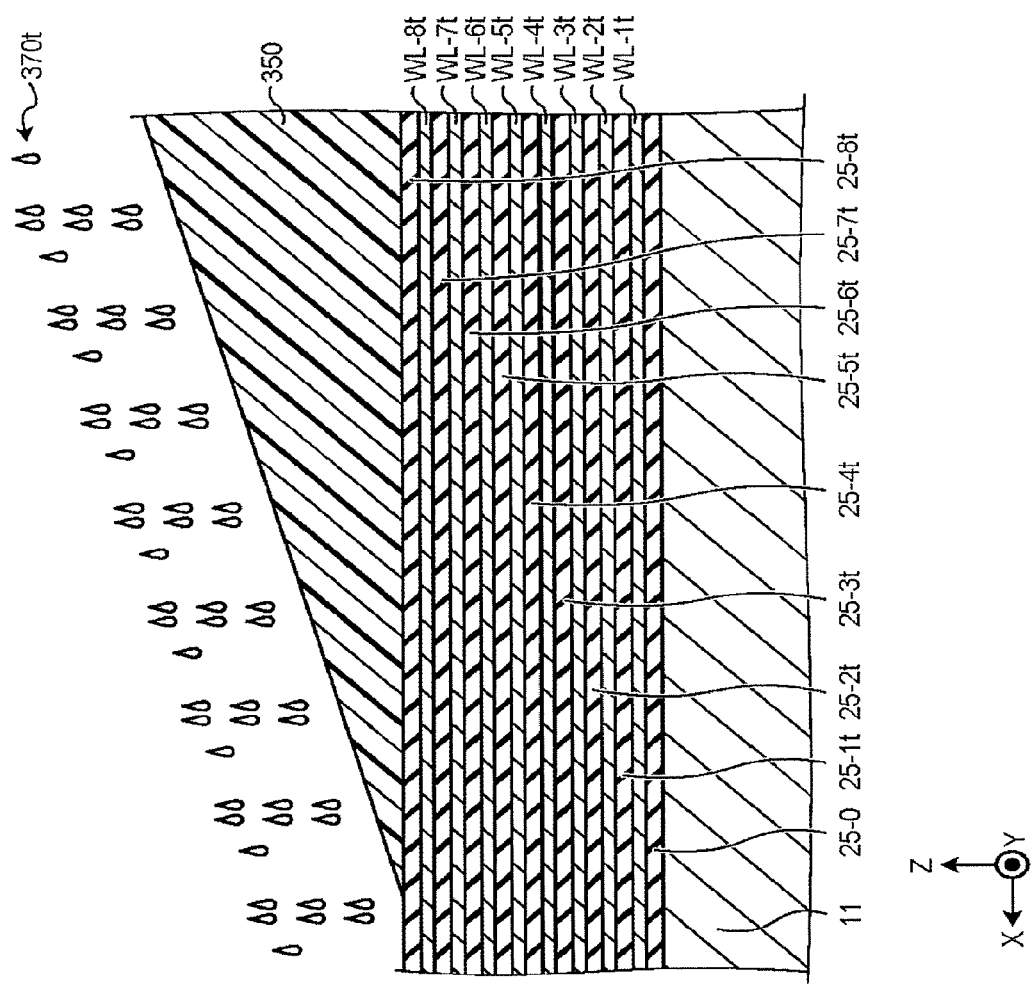

In the process step shown in FIG. 13B, a resist 370t for nanoimprint lithography (NIL) is dropped onto the resist pattern 350. At this time, the droplet density can be set different in the respective regions by use of an ink-jet method or the like. For example, the resist 370t for NIL is applied onto the inclined surface structure 352 such that the droplet density on the regions to become near step-up surfaces is larger than the droplet density on the regions to become flat surfaces in order that the taper of the step-up surfaces can be shaped into perpendicular to the flat surfaces. That is, in the inclined surface structure 352, the resist is supplied onto the regions to become flat surfaces 370a to 370i (see FIG. 14B) by a first supply amount, and the resist is supplied onto the regions to become step-up surfaces 370j to 370q (see FIG. 14B) by a second supply amount. The second supply amount is larger than the first supply amount. Consequently, there is provided a state where the inclined surface structure 352 of the resist pattern 350 is covered with the resist 370t for NIL (see FIG. 14A).

Then, the template 100 for NIL shown in FIG. 5 is prepared in similar way to that in the first embodiment.

Figure 14A:
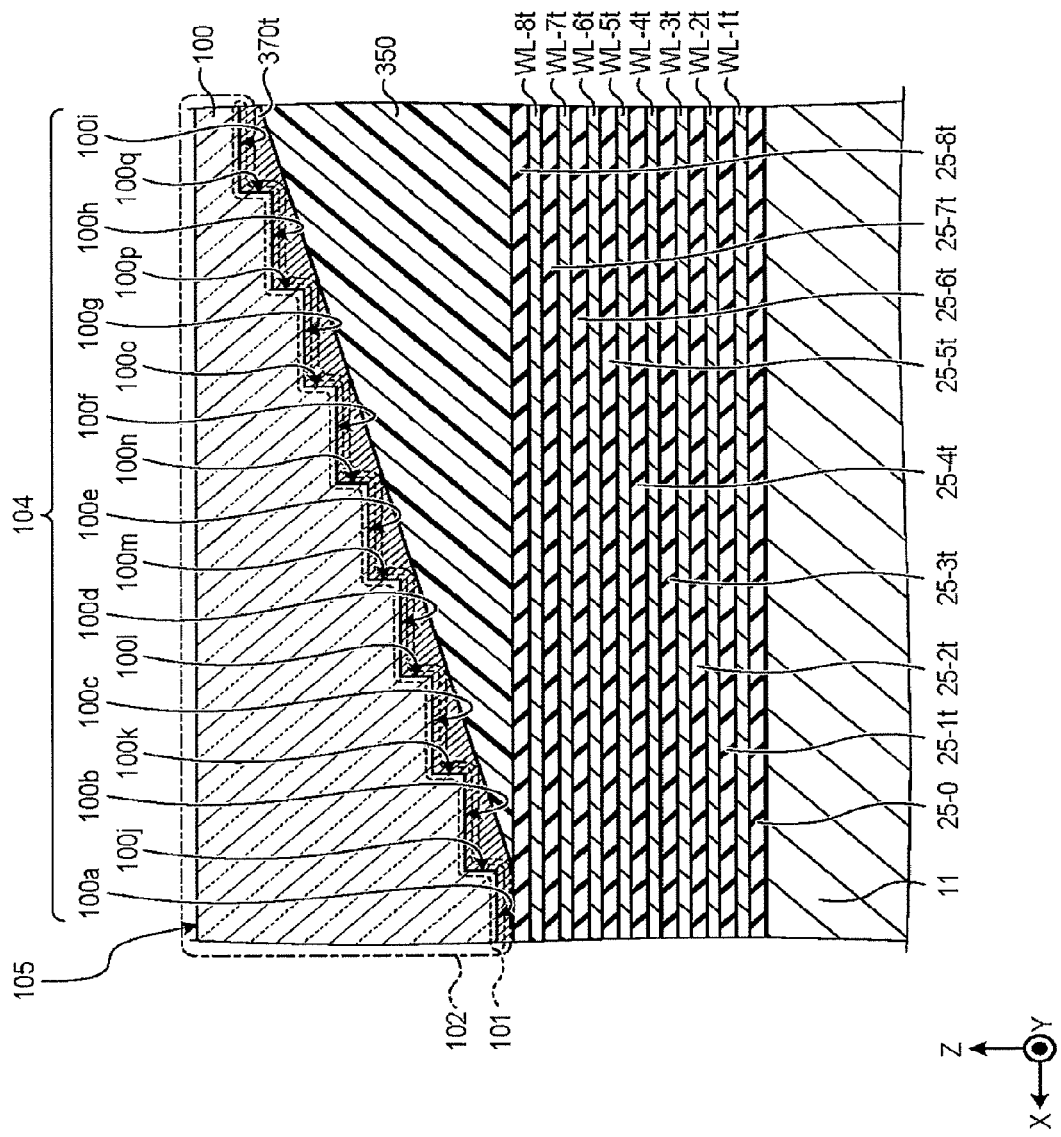
FIGS. 14A and 14B are sectional views showing the manufacturing method of a semiconductor device according to the third embodiment.

In the process step shown in FIG. 14A, a resist pattern 370 is formed on the resist pattern 350 by use of the template 100 for NIL. Specifically, the pattern face 104 of the template 100 is brought into contact with the resist 370t covering the resist pattern 350, and thereby the resist 370t flows onto the stepped structure 102 on the pattern face 104 by means of a capillary phenomenon. The template 100 and the resist 370t are kept in contact with each other for a predetermined time. Consequently, the resist 370t is filled onto the stepped structure 102 on the pattern face 104. That is, while there is kept a state where the inclined surface structure 352 of the resist pattern 350 is covered with the resist 370t, there is obtained a state where the flat surfaces 100a to 100i and the perpendicular surfaces 100j to 100q in the stepped structure 102 (stair shape 101) of the template 100 are covered with the resist 370t. In this state, the resist 370t is cured in a curing process.

Figure 14B:
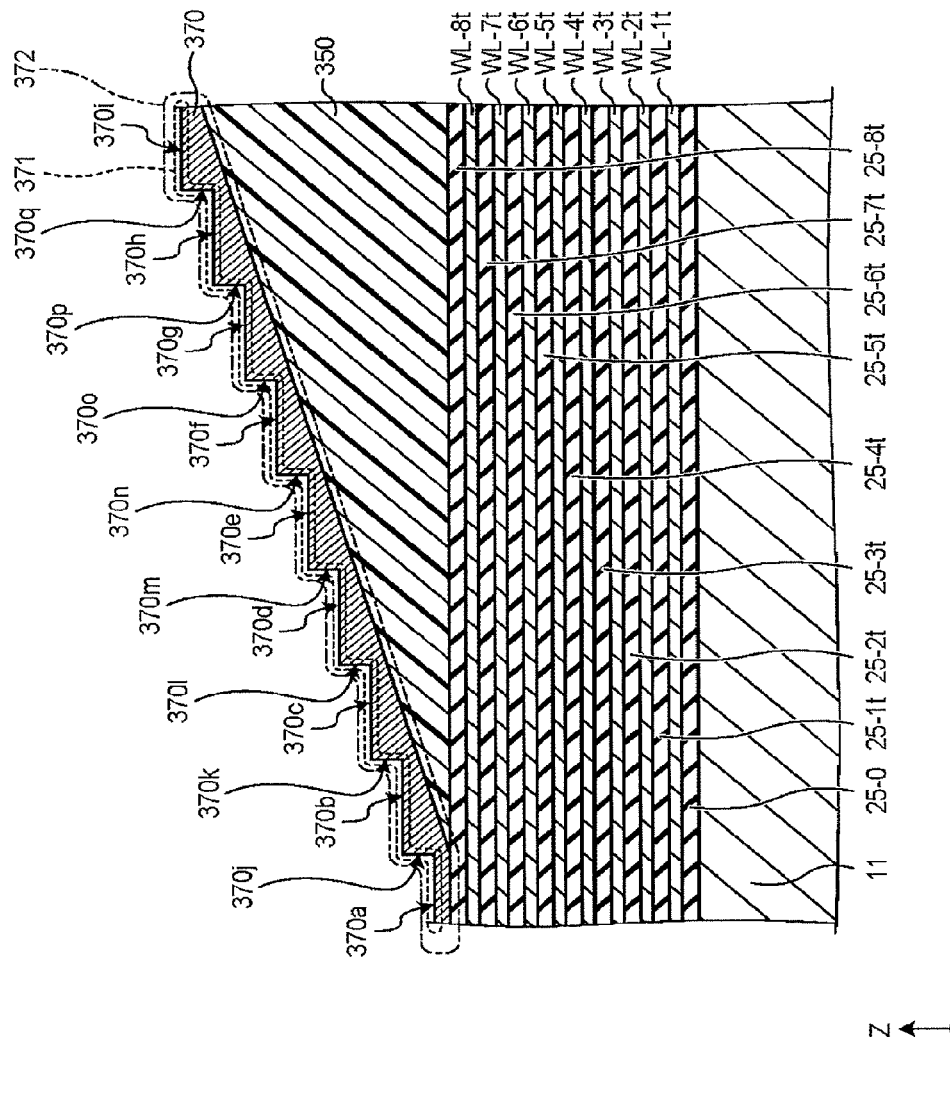

In the process step shown in FIG. 14B, the template 100 is separated, and thereby the resist pattern 370 is formed on the resist pattern 350. The resist pattern 370 has a stepped structure 372. The stepped structure 372 is a structure arranged corresponding to the inclined surface structure 352 (see FIG. 13A), and it includes a plurality of steps, and thus has a stair shape 371, for example. In the stair shape 371, flat surfaces 370a to 370i and step-up surfaces 370j to 370q are alternately arranged, for example, in the X direction, such that the step-up surfaces 370j to 370q respectively extend perpendicularly to the adjacent flat surfaces 370b to 370i. Consequently, the flat surfaces 370a to 370i of the stepped structure 372 (stair shape 371) can be easily formed while the flat surfaces 370a to 370i are kept stable in position and width.

As described above, in the third embodiment, the resist pattern 350 is formed with the inclined surface structure 352 by use of gray scale lithography, and then the resist pattern 370 is formed thereon such that the resist pattern 370 includes the stair shape 371 arranged corresponding to the inclined surface structure 352. Consequently, the resist pattern 370 having the stair shape 371 can be easily formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template for nanoimprint, comprising:
    a pattern face having a stepped structure including a plurality of steps; and
    a rear face opposite to the pattern face,
    wherein the pattern face includes
        a first flat surface,
        a first perpendicular surface extending from a first end of the first flat surface, in a direction perpendicular to the first flat surface and with an orientation going away from the rear face,
        a second flat surface extending from a first end of the first perpendicular surface, in a first direction along the rear face and with an orientation going away from the first flat surface,
        a second perpendicular surface extending from a first end of the second flat surface, in a direction perpendicular to the second flat surface and with an orientation going away from the rear face,
        a third flat surface extending from a first end of the second perpendicular surface, in the first direction and with an orientation going away from the second flat surface,
        a third perpendicular surface extending from a first end of the third flat surface, in a direction perpendicular to the third flat surface and with an orientation going away from the rear face, and
        a fourth flat surface extending from a first end of the third perpendicular surface, in the first direction and with an orientation going away from the third flat surface.

2. The template for nanoimprint according to claim 1, wherein,
    in the direction perpendicular to the first flat surface, a width of the first perpendicular surface, a width of the second perpendicular surface, and a width of the third perpendicular surface are substantially equal to each other.

3. The template for nanoimprint according to claim 1, wherein
    the pattern face further includes
        a fourth perpendicular surface extending from a second end of the first flat surface, in a direction perpendicular to the first flat surface and with an orientation going away from the rear face,
        a fifth flat surface extending from a first end of the fourth perpendicular surface, in a second direction along the rear face and with an orientation going away from the first flat surface,
        a fifth perpendicular surface extending from a first end of the fifth flat surface, in a direction perpendicular to the fifth flat surface and with an orientation going away from the rear face,
        a sixth flat surface extending from a first end of the fifth perpendicular surface, in the second direction and with an orientation going away from the fifth flat surface,
        a sixth perpendicular surface extending from a first end of the sixth flat surface, in a direction perpendicular to the sixth flat surface and with an orientation going away from the rear face, and
        a seventh flat surface extending from a first end of the sixth perpendicular surface, in the second direction and with an orientation going away from the sixth flat surface.

4. The template for nanoimprint according to claim 3, wherein,
    in the direction perpendicular to the first flat surface, a width of the fourth perpendicular surface, a width of the fifth perpendicular surface, and a width of the sixth perpendicular surface are substantially equal to each other.

* * * * *